(12) United States Patent
Liu et al.

(10) Patent No.: US 11,631,734 B2
(45) Date of Patent: Apr. 18, 2023

(54) VERTICAL CAPACITOR STRUCTURE HAVING CAPACITOR IN CAVITY, AND METHOD FOR MANUFACTURING THE VERTICAL CAPACITOR STRUCTURE

(71) Applicant: Advanced Semiconductor Engineering, Inc., Kaohsiung (TW)

(72) Inventors: Syu-Tang Liu, Kaohsiung (TW); Huang-Hsien Chang, Kaohsiung (TW); Tsung-Tang Tsai, Kaohsiung (TW); Hung-Jung Tu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 47 days.

(21) Appl. No.: 17/102,258

(22) Filed: Nov. 23, 2020

(65) Prior Publication Data
US 2021/0104595 A1    Apr. 8, 2021

Related U.S. Application Data

(63) Continuation of application No. 16/239,318, filed on Jan. 3, 2019, now Pat. No. 10,847,602.

(51) Int. Cl.
*H01L 49/02* (2006.01)
*H01L 21/02* (2006.01)
(Continued)

(52) U.S. Cl.
CPC ........ *H01L 28/40* (2013.01); *H01L 21/02118* (2013.01); *H01L 21/02164* (2013.01);
(Continued)

(58) Field of Classification Search
CPC .............. H01L 28/40; H01L 21/02118; H01L 21/02164; H01L 21/02178;
(Continued)

(56) References Cited

U.S. PATENT DOCUMENTS

| 5,874,757 A | 2/1999 | Chao |
| 6,093,600 A * | 7/2000 | Chen ................. H01L 27/10861 |
| | | 257/E21.59 |

(Continued)

OTHER PUBLICATIONS

Non-Final Office Action for U.S. Appl. No. 16/239,318, dated Apr. 10, 2020, 16 pages.
(Continued)

*Primary Examiner* — Michael Jung
(74) *Attorney, Agent, or Firm* — Foley & Lardner LLP

(57) ABSTRACT

A vertical capacitor structure includes a substrate, at least a pillar, a first conductive layer, a first dielectric layer and a second conductive layer. The substrate defines a cavity. The pillar is disposed in the cavity. The first conductive layer covers and is conformal to the cavity of the substrate and the pillar, and is insulated from the substrate. The first dielectric layer covers and is conformal to the first conductive layer. The second conductive layer covers and is conformal to the first dielectric layer. The first conductive layer, the first dielectric layer and the second conductive layer jointly form a capacitor component.

15 Claims, 15 Drawing Sheets

(51) Int. Cl.
*H01L 23/522* (2006.01)
*H01L 21/308* (2006.01)
*H01L 21/3105* (2006.01)
*H01L 21/285* (2006.01)

(52) U.S. Cl.
CPC .. *H01L 21/02178* (2013.01); *H01L 21/02181* (2013.01); *H01L 21/02183* (2013.01); *H01L 21/02186* (2013.01); *H01L 21/02236* (2013.01); *H01L 21/2855* (2013.01); *H01L 21/28556* (2013.01); *H01L 21/308* (2013.01); *H01L 21/31058* (2013.01); *H01L 23/5223* (2013.01)

(58) Field of Classification Search
CPC ......... H01L 21/02181; H01L 21/02183; H01L 21/02186; H01L 21/02236; H01L 21/2855; H01L 21/28556; H01L 21/308; H01L 21/31058; H01L 23/5223
See application file for complete search history.

(56) References Cited

U.S. PATENT DOCUMENTS

| 6,417,535 | B1 | 7/2002 | Johnson et al. |
| 6,620,701 | B2 | 9/2003 | Ning |
| 2008/0246069 | A1* | 10/2008 | Dyer ...................... H01L 28/87 257/E29.345 |
| 2009/0001438 | A1 | 1/2009 | Doyle et al. |
| 2017/0141115 | A1* | 5/2017 | Bower .................... H01L 28/40 |
| 2017/0250159 | A1 | 8/2017 | Lee |
| 2019/0103227 | A1* | 4/2019 | Lu .......................... H01G 4/385 |

OTHER PUBLICATIONS

Notice of Allowance for U.S. Appl. No. 16/239,318, dated Jul. 22, 2020, 8 pages.

* cited by examiner

VERTICAL CAPACITOR STRUCTURE HAVING CAPACITOR IN CAVITY, AND METHOD FOR MANUFACTURING THE VERTICAL CAPACITOR STRUCTURE

CROSS-REFERENCE TO RELATED APPLICATION

This application is a continuation of U.S. patent application Ser. No. 16/239,318 filed Jan. 3, 2019, the contents of which is incorporated herein by reference in its entirety.

BACKGROUND

1. Field of the Disclosure

The present disclosure relates to a capacitor structure and a method, and to a vertical capacitor structure and a method for manufacturing the vertical capacitor structure.

2. Description of the Related Art

A comparative circuit may include one or more passive devices, where a passive device is a component such as a capacitor, a resistor or an inductor. To achieve microminiaturization, there is a trend to integrate passive devices into a semiconductor device. However, a plane type capacitor includes three stacked plane layers, and when integrated by disposing the capacitor on a surface of an insulating layer, the capacitor can occupy a large space. In addition, within a limited area, the capacitance of the capacitor is low.

SUMMARY

In some embodiments, a vertical capacitor structure includes a substrate, at least a pillar, a first conductive layer, a first dielectric layer and a second conductive layer. The substrate defines a cavity. The pillar is disposed in the cavity. The first conductive layer covers and is conformal to the cavity of the substrate and the pillar, and is insulated from the substrate. The first dielectric layer covers and is conformal to the first conductive layer. The second conductive layer covers and is conformal to the first dielectric layer. The first conductive layer, the first dielectric layer and the second conductive layer jointly form a capacitor component.

In some embodiments, a capacitor component includes a first conductive layer, a first dielectric layer and a second conductive layer. The first dielectric layer covers and is conformal to the first conductive layer. The second conductive layer covers and is conformal to the first dielectric layer. The capacitor component has at least one first portion in a truncated hollow cone shape, and a second portion in a substantially plane shape extending from a lower edge of the first portion.

In some embodiments, a method for manufacturing a vertical capacitor structure includes: (a) forming a cavity in a substrate; (b) forming at least one pillar in the cavity; (c) forming a first conductive layer covering and conformal to the cavity of the substrate and the pillar, wherein the first conductive layer is insulated from the substrate and the pillar; (d) forming a first dielectric layer covering and conformal to the first conductive layer; and (e) forming a second conductive layer covering and conformal to the first dielectric layer, wherein the first conductive layer, the first dielectric layer and the second conductive layer jointly form a capacitor component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
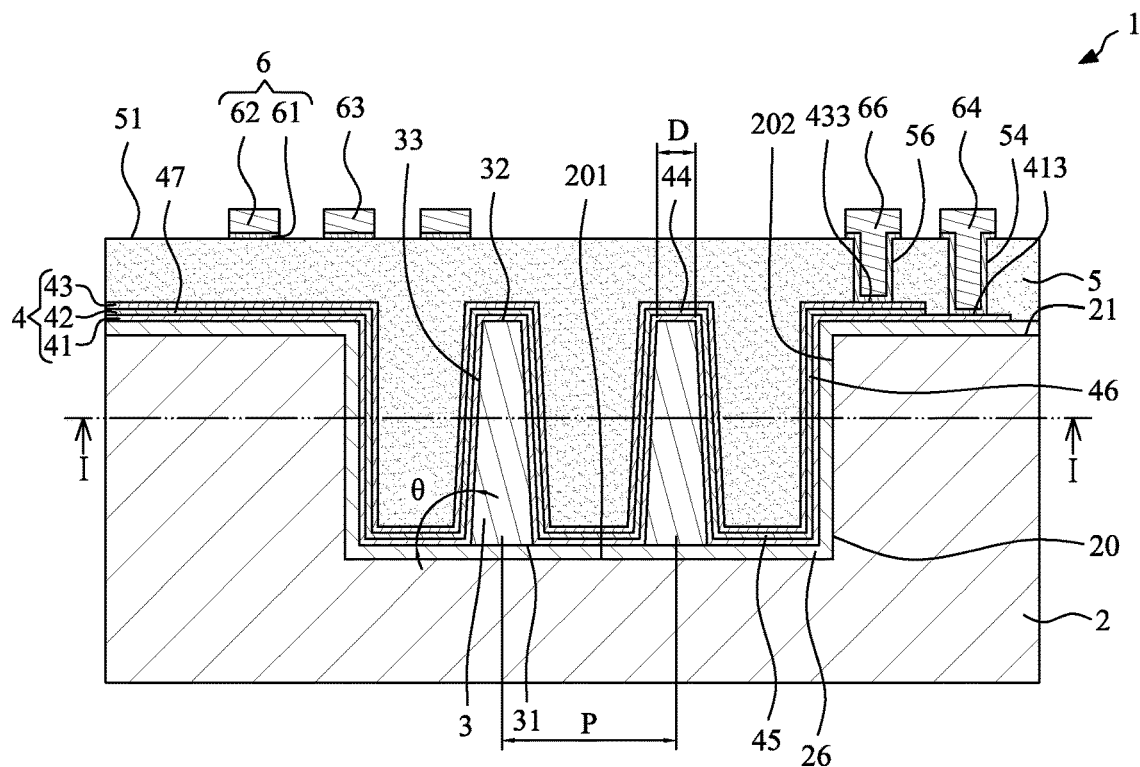
FIG. 1 illustrates a cross-sectional view of an example of a vertical capacitor structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To improve the capacitance of the plane type capacitor, a vertical capacitor is provided. In a method for manufacturing an example vertical capacitor, a glass wafer (or a glass substrate) is provided, and a plurality of holes is formed thereon by, for example, drilling. Then, the capacitor is formed on the side walls of the holes. However, an aspect ratio of the holes may not be large enough, thus the capacitance of such vertical capacitor is constrained. In a method for manufacturing another example vertical capacitor, a silicon wafer is etched to form a plurality of deep holes to increase a surface area of thereof. An aspect ratio of the deep holes may be as large as about 20:1. Then, the surface of the silicon wafer is polarized by an implanter process, such that the surface of the silicon wafer is doped with N/P to form a conductive surface. A dielectric layer, a conductive layer and electrodes are then formed on the conductive surface of the silicon wafer, thus forming the vertical capacitor. However, the etching process for the deep holes and the implanter process may be difficult and expensive.

Figure 2:
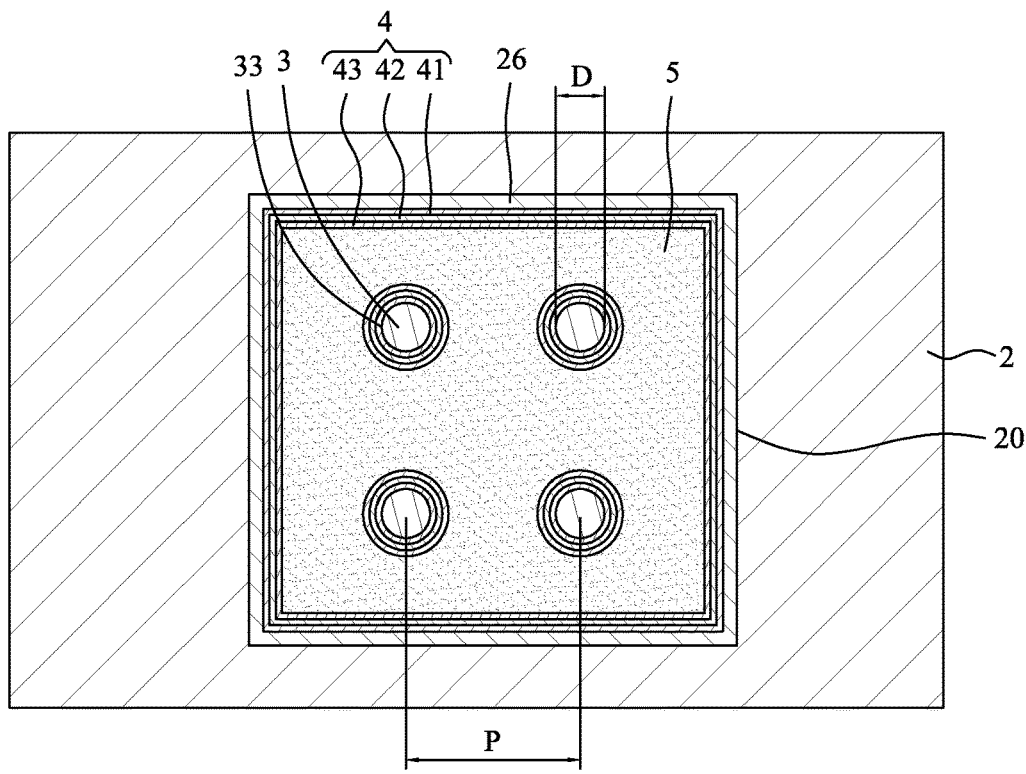
FIG. 2 illustrates a cross-sectional view taken along line I-I of the vertical capacitor structure shown in FIG. 1.

The present disclosure addresses at least the above concerns and provides for a method for an improved vertical capacitor structure, and improved techniques for manufacturing the vertical capacitor structure. The vertical capacitor may be manufactured without the need of the etching process for the deep holes and the implanter process FIG. 1 illustrates a cross-sectional view of a vertical capacitor structure 1 according to some embodiments of the present disclosure. FIG. 2 illustrates a cross-sectional view taken along line I-I of the vertical capacitor structure 1 shown in FIG. 1. The vertical capacitor structure 1 includes a substrate 2, at least one pillar 3, a first conductive layer 41, a first dielectric layer 42, a second conductive layer 43, a dielectric structure 5 and a circuit layer 6.

The substrate 2 may be a substrate of any type. For example, the substrate 2 may be made of semiconducting material (e.g., silicon) or insulating material (e.g., glass). The substrate 2 has an upper surface 21 and defines a cavity 20 recessed from the upper surface 21. As shown in FIG. 1, the cavity 20 is defined by a bottom surface 201 and a lateral surface 202. For example, the lateral surface 202 extends from an edge of the bottom surface 201 to the upper surface 21. In some embodiments, the lateral surface 202 may be substantially perpendicular to the bottom surface 201 and the upper surface 21. The bottom surface 201 and the upper surface 21 may be substantially parallel to each other.

In some embodiments, the substrate 2 may include an insulating layer 26 (e.g., a barrier layer). The insulating layer 26 is disposed in and covers the cavity 20, such as covering the bottom surface 201 and the lateral surface 202. The insulating layer 26 may further cover the upper surface 21 of the substrate 2. Due to the arrangement of the insulating layer 26, the substrate 2 is insulated from other components disposed thereon, such as the first conductive layer 41. For example, the insulating layer 26 may be formed by oxidizing surfaces of the substrate 2 (e.g., the upper surface 21, and the bottom surface 201 and the lateral surface 202 of the cavity 20). A material of the insulating layer 26 may be silicon oxide. However, the insulating layer 26 may be omitted if the substrate 2 is made of an insulating material (e.g., glass).

The pillar 3 is disposed in the cavity 20 of the substrate 2. FIGS. 1 and 2 show 2×2 pillars 3 for illustration purpose. In some embodiments, the vertical capacitor structure 1 may include at least about 20×20 pillars 3. However, the amount and arrangement of the pillar 3 are not limited in the present disclosure. The pillar 3 has a bottom surface 31, an upper surface 32 opposite to the bottom surface 31, and a lateral surface 33 extending between the bottom surface 31 and the upper surface 32. As shown in FIG. 1, the pillar 3 stands on the insulating layer 26. The bottom surface 31 is disposed on and contacts the insulating layer 26. That is, the bottom surface 31 is a boundary between the pillar 3 and the insulating layer 26. For example, the bottom surface 31 is adhered to the insulating layer 26. However, in other embodiments, the insulating layer 26 may be omitted, thus the pillar 3 may stand directly on the bottom surface 201 of the cavity 20 of the substrate 2. That is, the bottom surface 31 is a boundary between the pillar 3 and the substrate 2. In some embodiments, a height of the pillar 3 may be substantially equal to the depth of the cavity 20 of the substrate 2.

Figure 14:
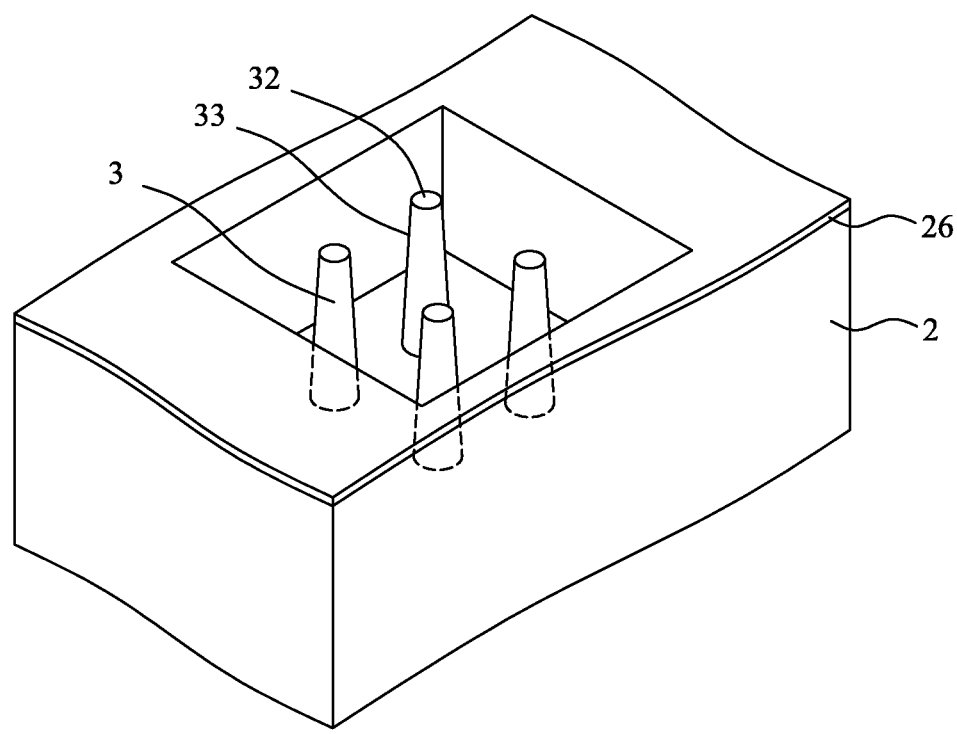
FIG. 14 illustrates one or more stages of an example of a method for manufacturing a vertical capacitor structure according to some embodiments of the present disclosure.

As shown in FIG. 1, the pillar 3 tapers upward. In some embodiments, the pillar 3 is in a truncated cone-shape (as shown in FIG. 14). For example, the pillar 3 may be in a shape of a right circular cone, while a portion including an apex of the circular cone is omitted. Accordingly, an area of the bottom surface 31 may be greater than an area of the upper surface 32. The lateral surface 33 is not perpendicular to the bottom surface 201 of the cavity 20 of the substrate 2. For example, an angle θ between the lateral surface 33 of the pillar 3 and the bottom surface 201 of the cavity 20 of the substrate 2 is in a range of about 91 degrees to about 95 degrees.

The pillar 3 is preferably made of an insulating material. For example, the pillar 3 may be made of a cured photoimageable dielectric (PID) material such as epoxy or polyimide (PI) including photoinitiators. In some embodiments, a material of the pillar 3 is different from a material of the substrate 2 and a material of the insulating layer 26.

In some embodiments, the pillar 3 has a minimum diameter "D". For example, the minimum diameter "D" may be located at or adjacent to the upper surface 32 of the pillar 3. A pitch "P" is defined as a distance between the centers of adjacent two pillars 3. The pitch "P" is substantially equal to or greater than twice the minimum diameter "D". If the pitch "P" is too small, other components (e.g., the first conductive layer 41, the first dielectric layer 42 and the second conductive layer 43) disposed on the adjacent two pillars 3 may contact each other, thus forming a short circuit therebetween. On the other hand, an increased "P" may reduce the maximum amount of the pillars 3 disposed in the cavity 20 of the substrate 2. For example, the minimum diameter "D" may be about 20 μm, and the pitch "P" may be equal to or greater than about 40 μm.

The first conductive layer 41 is disposed in the cavity 20 of the substrate 2 and on the pillar 3. The first conductive layer 41 covers and is conformal to the cavity 20 of the substrate 2 and the pillar 3. For example, the first conductive layer 41 covers and is conformal to the upper surface 32 and the lateral surface 33 of the pillar 3, and covers the insulating layer 26 disposed on portions of the bottom surface 201 of the cavity 20 which is not covered by the pillar 3, the lateral surface 202 of the cavity 20, and the upper surface 21 of the substrate 2, such that the first conductive layer 41 is insulated from the substrate 2. The first conductive layer 41 is further disposed on the upper surface 21 of the substrate 2. However, in other embodiments, the first conductive layer 41 may directly contact and be conformal to the upper surface 32 and the lateral surface 33 of the pillar 3, portions of the bottom surface 201 of the cavity 20 which is not covered by the pillar 3, the lateral surface 202 of the cavity 20, and the upper surface 21 of the substrate 2. The first conductive layer 41 has a pad portion 413 on the upper surface 21 of the substrate 2. The first conductive layer 41 may be made of a conductive material, and may be formed by physical or chemical vapor deposition. A thickness of the first conductive layer 41 may be about 0.5 μm to about 3 μm.

The first dielectric layer 42 covers and is conformal to the first conductive layer 41. For example, the first dielectric layer 42 is disposed on and contacts the first conductive layer 41. The first dielectric layer 42 may further be disposed on the upper surface 21 of the substrate 2. The first dielectric layer 42 covers the first conductive layer 41 on the upper surface 21 of the substrate 2, while the pad portion 413 of the first conductive layer 41 is exposed from the first dielectric layer 42. The first dielectric layer 42 may be made of a dielectric material, such as $Ta_2O_5$, $Al_2O_3$, $TiO_2$ or $HfO_2$. A relative permittivity of the first dielectric layer 42 may be about 8 to about 80. The first dielectric layer 42 may also be formed by physical or chemical vapor deposition, or by atomic layer deposition (ALD). A thickness of the first dielectric layer 42 may be about 10 nm to about 20 nm.

The second conductive layer 43 covers and is conformal to the first dielectric layer 42. For example, the second conductive layer 43 is disposed on and contacts the first dielectric layer 42. The second conductive layer 43 may further be disposed on the upper surface 21 of the substrate 2. The second conductive layer 43 has a pad portion 433 on the upper surface 21 of the substrate 2. The second conductive layer 43 may be made of a conductive material, and may be formed by physical or chemical vapor deposition. A thickness of the second conductive layer 43 may be about 0.5 μm to about 3 μm.

The first conductive layer 41, the first dielectric layer 42 and the second conductive layer 43 jointly form a capacitor component 4. That is, the capacitor component 4 may include the first conductive layer 41, the first dielectric layer 42, and the second conductive layer 43. The capacitor component 4 is a vertical capacitor. A cross section of the capacitor component 4, as shown in FIG. 1, is substantially in a serpentine shape or a rectangular wave shape.

The capacitor component 4 may have at least one first portion 44, a second portion 45, a third portion 46 and a fourth portion 47. The first portion 44 is in a truncated hollow cone shape, and is disposed on and conformal to the pillar 3. That is, the first portion 44 is disposed on the upper surface 32 and the lateral surface 33 of the pillar 3. The first portion 44 may taper upward. The second portion 45 extends from a lower edge of the first portion 44 to the edge of the bottom surface 201 of the cavity 20 of the substrate 2, and is disposed on a bottom surface 201 of the cavity 20 of the substrate 2. The second portion 45 is substantially in a plane shape. The third portion 46 extends from an edge of the second portion 45 to the top edge of the cavity 20 of the substrate 2, and is disposed on a lateral surface 202 of the cavity 20 of the substrate 2. The third portion 46 is substantially perpendicular to the second portion 45. An angle θ at an intersection of the first portion 44 and the second portion 45 is in a range between about 91 degrees to about 95 degrees. The fourth portion 47 extends from an upper edge of the third portion 46, and is disposed on the upper surface 21 of the substrate 2. The fourth portion 47 is substantially perpendicular to the third portion 46.

In some embodiments, the capacitor component 4 has a plurality of first portions 44, and the second portion 45 connects the first portions 44. A pitch "P" between adjacent two of the first portions 44 is equal to or greater than twice a minimum diameter "D" of the first portions 44.

The dielectric structure 5 is disposed on and covers the capacitor component 4. The dielectric structure 5 is disposed in the cavity 20 and on the upper surface 21 of the substrate 2. For example, the dielectric structure 5 fills the cavity 20 of the substrate 2, and has an upper surface 51 which may substantially be planar. A material of the dielectric structure 5 may include an insulating material, a passivation material, a dielectric material or a solder resist material, such as, for example, a benzocyclobutene (BCB) based polymer or a polyimide (PI). As shown in FIG. 1, the dielectric structure 5 covers the first portion 44 of the capacitor component 4. That is, the peripheral outer surface of the first portion 44 of the capacitor component 4 is surrounded by the dielectric structure 5. The dielectric structure 5 defines a first opening 54 extending through the dielectric structure 5 to expose a portion of the first conductive layer 41, and a second opening 56 extending through the dielectric structure 5 to expose a portion of the second conductive layer 43. The first opening 54 and the second opening 56 may be located on the upper surface 21 of the substrate 2. For example, the first opening 54 exposes the pad portion 413 of the first conductive layer 41. The second opening 56 exposes the pad portion 433 of the second conductive layer 43.

The circuit layer 6 is disposed on the upper surface 51, and in the first opening 54 and the second opening 56 of the dielectric structure 5. The circuit layer 6 may be a redistribution layer (RDL) that includes a trace 63, a first terminal 64 and a second terminal 66. The trace 63 is disposed on the upper surface 51 of the dielectric structure 5. The first terminal 64 is disposed in the first opening 54 of the dielectric structure 5 and contacts the first conductive layer 41, such as the pad portion 413 of the first conductive layer 41. The second terminal 66 is disposed in the second opening 56 of the dielectric structure 5 and contacts the second conductive layer 43, such as the pad portion 433 of the second conductive layer 43. As can be seen in FIG. 1, the circuit layer 6 includes a seed layer 61 and a conductive layer 62. The seed layer 61 may be made of copper and/or titanium, and the conductive layer 62 may be made of copper.

In the vertical capacitor structure 1, since the capacitor component 4 (including the first conductive layer 41, the first dielectric layer 42 and the second conductive layer 43) is conformal to the cavity 20 of the substrate 2 and the pillar 3, a total area of the capacitor component 4, especially of the first dielectric layer 42, is dramatically increased. Accordingly, a capacitance density of the vertical capacitor structure 1 (e.g., the capacitance density of the capacitor component 4) is also increased.

Comparing to the exemplary vertical capacitor structure mentioned above, since the vertical capacitor structure 1 utilizes the pillars 3, instead of deep holes, to increase the surface area of the substrate, the etching process for forming deep holes can be omitted. Besides, the implanted process is not necessary for forming the vertical capacitor structure 1.

The capacitance "C" of the capacitor component 4 may be calculated by using the equation below, with "κ" representing a relative permittivity of the first dielectric layer 42, "$\varepsilon_0$" representing vacuum permittivity, "A" representing a total area of the first dielectric layer 42, and "d" representing a thickness of the first dielectric layer 42.

$$C = \kappa \varepsilon_0 \frac{A}{d}$$

In some embodiments, an area of the bottom surface 201 may be 800 μm×800 μm, and a depth of the cavity 20 may be about 100 μm. The minimum diameter "D" of the pillar 3 may be about 20 μm, and the pitch "P" between adjacent two pillars 3 may be about 20 μm. The height of the pillar 3 is substantially equal to the depth of the cavity 20. The thickness of the first dielectric layer 42 may be about 10 nm to about 20 nm, and the relative permittivity of the first dielectric layer 42 may be about 8 to about 80. The "capacitance density" may be defined as a capacitance in a predetermined area, e.g., the capacitance of the capacitor component 4 divided by the area of the capacitor component 4 on a plane of the upper surface 21 of the substrate 2, which is approximately the area of the bottom surface 201. According to the above criteria, a capacitance density of the capacitor component 4 may be greater than about 70 nF/mm².

Figure 3:
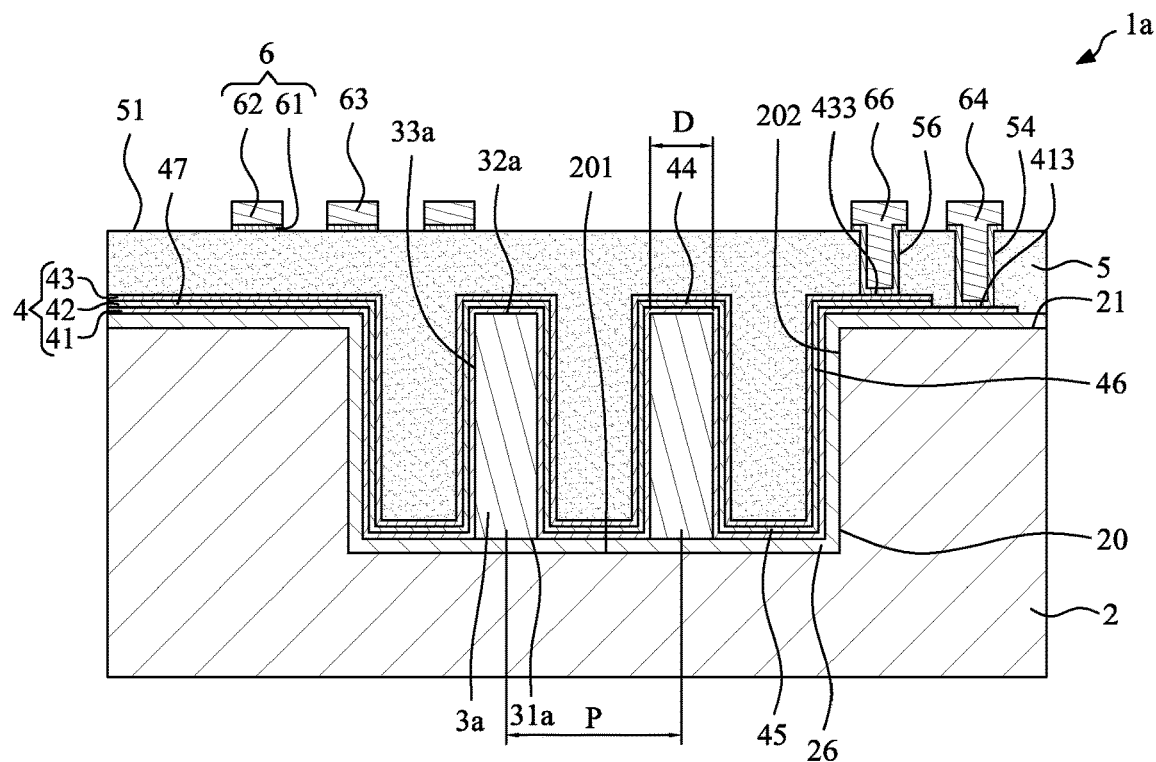
FIG. 3 illustrates a cross-sectional view of an example of a vertical capacitor structure according to some embodiments of the present disclosure.

FIG. 3 illustrates a cross-sectional view of a vertical capacitor structure 1a according to some embodiments of the present disclosure. The vertical capacitor structure 1a is similar to the vertical capacitor structure 1 shown in FIGS. 1 and 2, except for the structure of the pillar 3a.

As shown in FIG. 3, the pillar 3a also has a bottom surface 31a, an upper surface 32a opposite to the bottom surface 31a, and a lateral surface 33a extending between the bottom surface 31a and the upper surface 32a. However, the pillar 3a is substantially in a cylinder shape. That is, the lateral surface 33a is substantially perpendicular to the bottom surface 31a and the upper surface 32a, and is substantially perpendicular to the bottom surface 201 of the cavity 20 of the substrate 2. Besides, an area of the bottom surface 31a may substantially be equal to the upper surface 32a.

Figure 4:
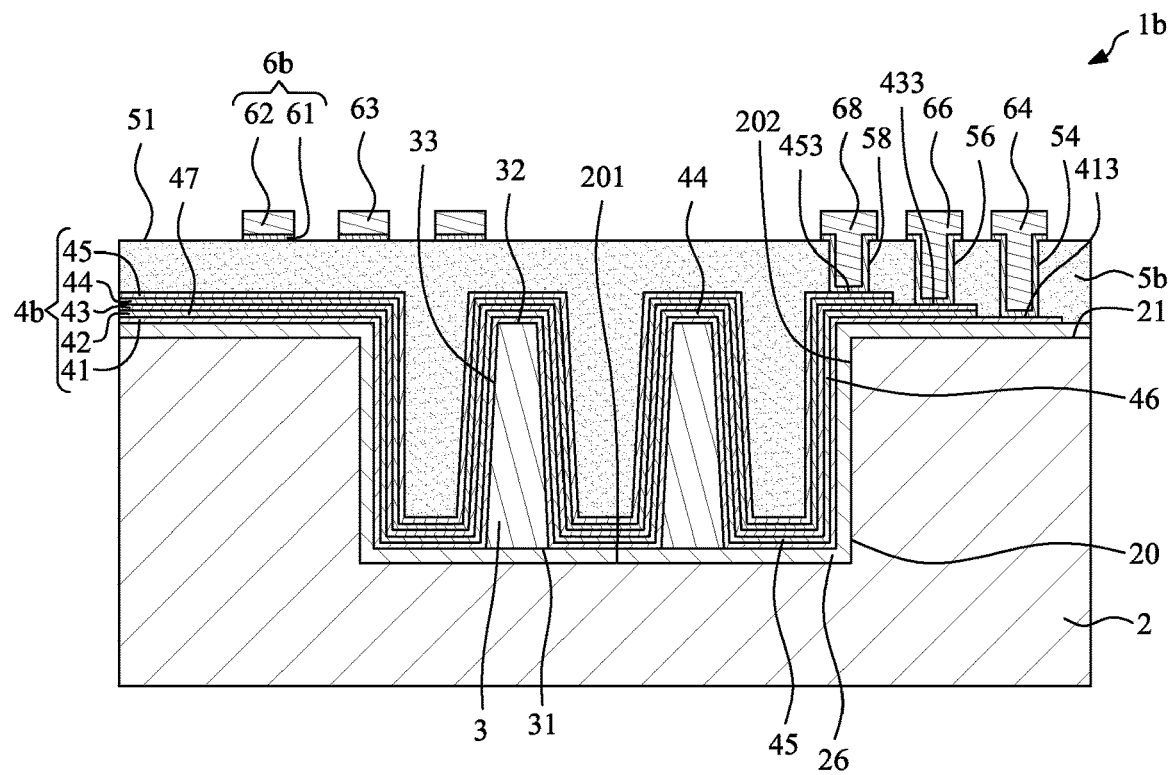
FIG. 4 illustrates a cross-sectional view of an example of a vertical capacitor structure according to some embodiments of the present disclosure.

FIG. 4 illustrates a cross-sectional view of a vertical capacitor structure 1b according to some embodiments of the present disclosure. The vertical capacitor structure 1b is similar to the vertical capacitor structure 1 shown in FIGS. 1 and 2, except for the structure of the capacitor component 4b, the dielectric structure 5b and the circuit layer 6b.

As shown in FIG. 4, the capacitor component 4b also includes the first conductive layer 41, the first dielectric layer 42 and the second conductive layer 43, but further includes a second dielectric layer 44 and a third conductive layer 45. The first conductive layer 41, the first dielectric layer 42 and the second conductive layer 43 of the capacitor component 4b are similar to those of the capacitor component 4 shown in FIGS. 1 and 2.

The second dielectric layer 44 is similar to the first dielectric layer 42. The second dielectric layer 44 covers and is conformal to the second conductive layer 43. For example, the second dielectric layer 44 is disposed on and contacts the second conductive layer 43. The second dielectric layer 44 may further be disposed on the upper surface 21 of the substrate 2. The second dielectric layer 44 covers the second conductive layer 43 on the upper surface 21 of the substrate 2, while the pad portion 433 of the second conductive layer 43 is exposed from the second dielectric layer 44. Material, thickness and forming process of the second dielectric layer 44 may be the same as the first dielectric layer 42.

The third conductive layer 45 is similar to the second conductive layer 43 and/or the first conductive layer 41. The third conductive layer 45 covers and is conformal to the second dielectric layer 44. For example, the third conductive layer 45 is disposed on and contacts the second dielectric layer 44. The third conductive layer 45 may further be disposed on the upper surface 21 of the substrate 2. The third conductive layer 45 has a pad portion 453 on the upper surface 21 of the substrate 2. Material, thickness and forming process of the third conductive layer 45 may be the same as the second conductive layer 43 and/or the first conductive layer 41.

Accordingly, the dielectric structure 5 further defines a third opening 58 to expose a portion of the third conductive layer 45. The third opening 58 may be located on the upper surface 21 of the substrate 2. For example, the third opening 58 exposes the pad portion 453 of the third conductive layer 45.

In the vertical capacitor structure 1b, since the capacitor component 4b includes two dielectric layers (e.g., the first dielectric layer 42 and the second dielectric layer 44), a capacitance density thereof may be twice the capacitance density of the vertical capacitor structure 1 shown in FIGS.

1 and 2. For example, the capacitance density of the vertical capacitor structure 1b may be greater than about 140 NF/mm².

FIG. 5 through FIG. 30 illustrate a method for manufacturing a vertical capacitor structure according to some embodiments of the present disclosure. In some embodiments, the method is for manufacturing a vertical capacitor structure such as the vertical capacitor structure 1 shown in FIGS. 1 and 2.

Figure 5:
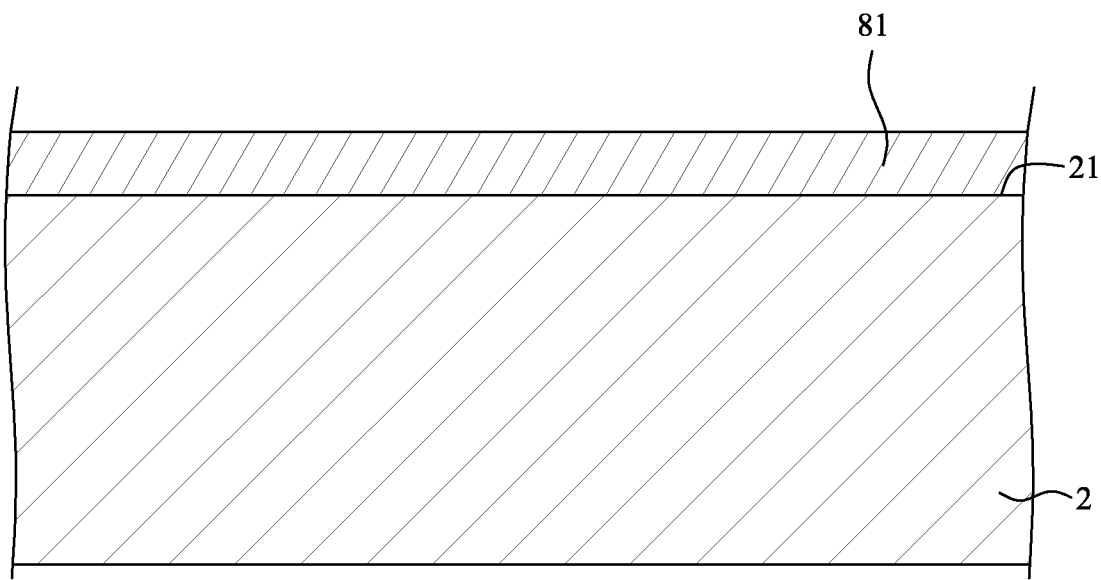
FIG. 5 illustrates one or more stages of an example of a method for manufacturing a vertical capacitor structure according to some embodiments of the present disclosure.

Referring to FIG. 5, a substrate 2 is provided, and a photoresist layer 81 is disposed thereon. The substrate 2 may be a substrate of any type. For example, the substrate 2 may be made of semiconducting material (e.g., silicon) or insulating material (e.g., glass). The substrate 2 has an upper surface 21, and the photoresist layer 81 is disposed on the upper surface 21.

Figure 6:
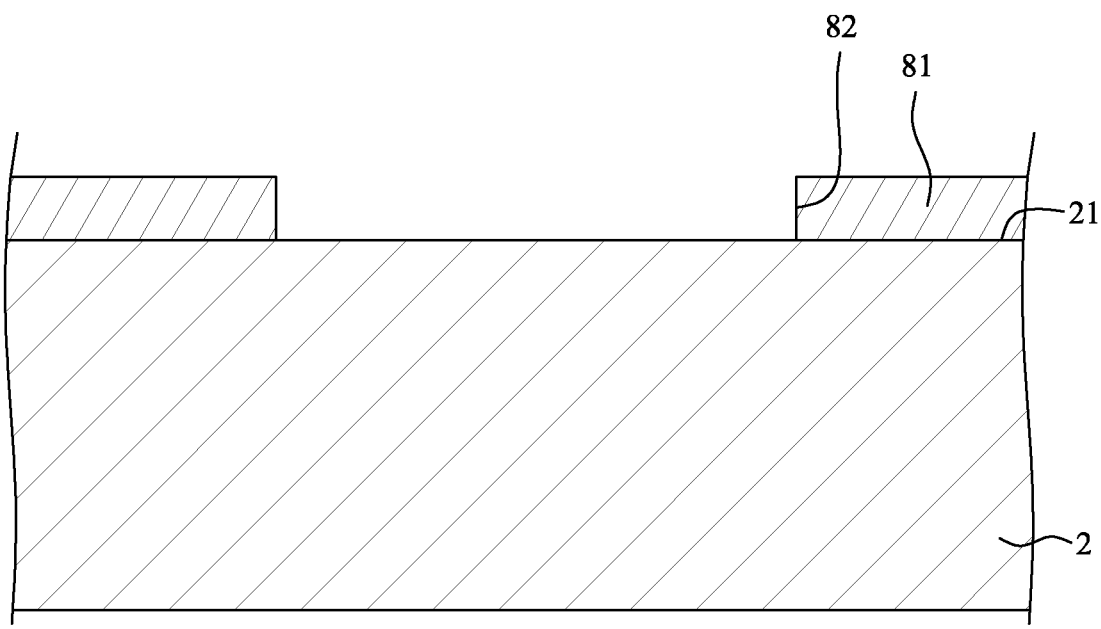
FIG. 6 illustrates one or more stages of an example of a method for manufacturing a vertical capacitor structure according to some embodiments of the present disclosure.

Referring to FIG. 6, the photoresist layer 81 is patterned to define a through hole 82. Processes for patterning the photoresist layer 81 may include exposure and development. For example, the photoresist layer 81 may be exposed to a patterned light, thus a portion of the photoresist layer is cured. Then, the photoresist layer 81 is developed. Another portion of the photoresist layer 81 which is not cured is removed during the development process.

Figure 7:
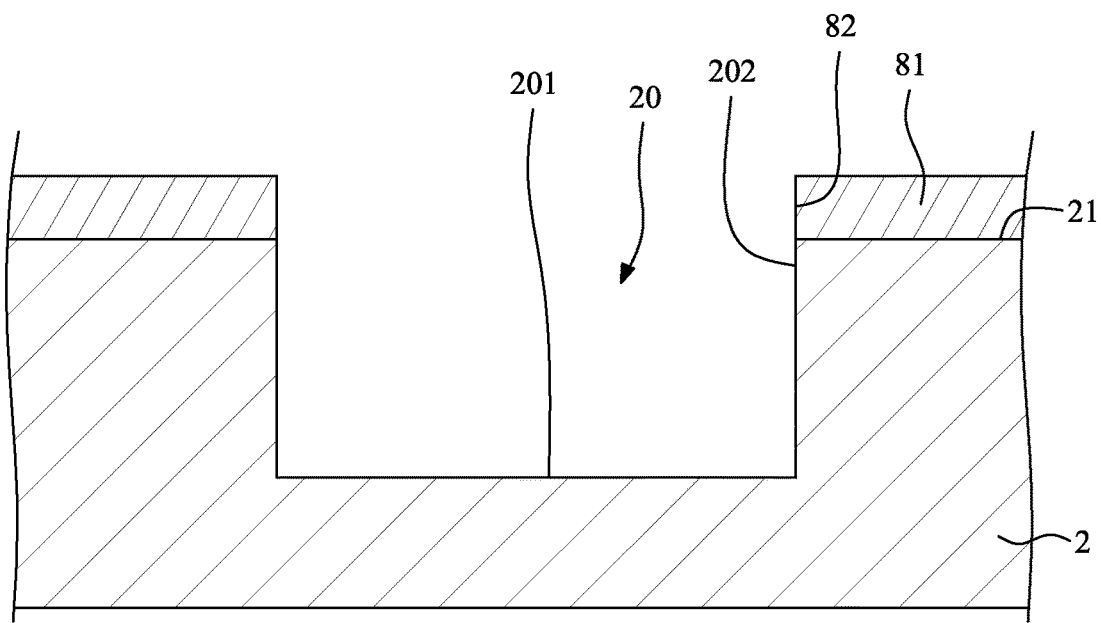
FIG. 7 illustrates one or more stages of an example of a method for manufacturing a vertical capacitor structure according to some embodiments of the present disclosure.

Referring to FIG. 7, the substrate 2 is etched with the photoresist layer 81 serving as a mask, thus forming a cavity 20 in the substrate 2 corresponding to the through hole 82 of the photoresist layer 81. The cavity 20 is recessed from the upper surface 21 of the substrate 2. As shown in FIG. 7, the cavity 20 is defined by a bottom surface 201 and a lateral surface 202. For example, the lateral surface 202 extends from an edge of the bottom surface 201 to the upper surface 21. In some embodiments, the lateral surface 202 may be substantially perpendicular to the bottom surface 201 and the upper surface 21. The bottom surface 201 and the upper surface 21 may be substantially parallel to each other.

Figure 8:
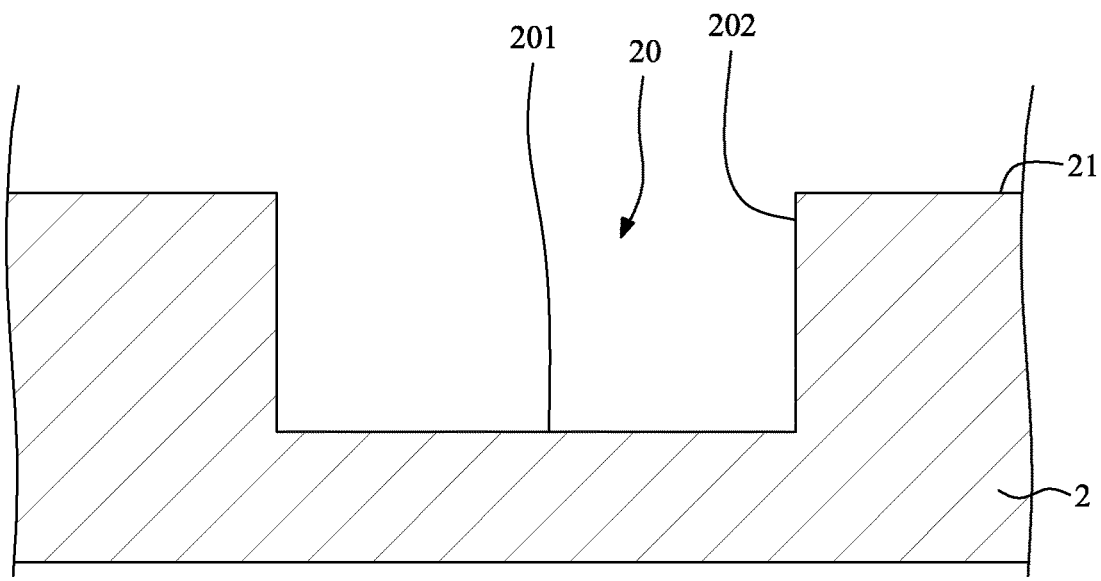
FIG. 8 illustrates one or more stages of an example of a method for manufacturing a vertical capacitor structure according to some embodiments of the present disclosure.
Figure 9:
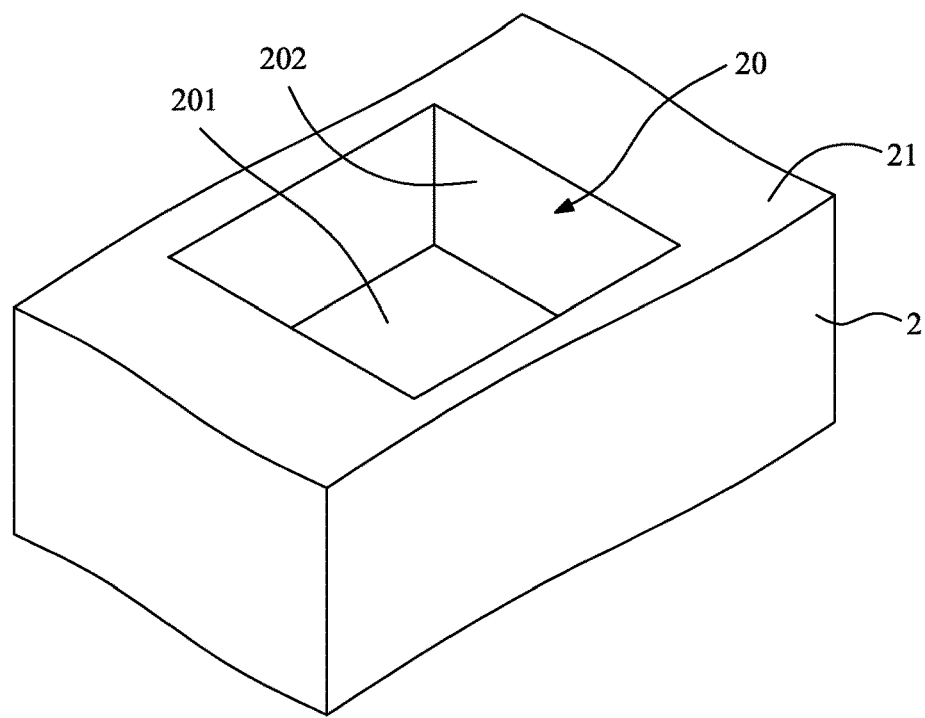
FIG. 9 illustrates one or more stages of an example of a method for manufacturing a vertical capacitor structure according to some embodiments of the present disclosure.

Referring to FIG. 8, the photoresist layer 81 is removed, and the upper surface 21 of the substrate 2 is exposed. FIG. 9 illustrates a perspective view of the substrate 2. In some embodiments, an area of the bottom surface 201 of the cavity 20 may be about 800 nm×800 nm, and a depth thereof may be about 100 nm. Since the bottom surface 201 of the cavity 20 has a large area relative to the depth of the cavity 20, the etching process for forming the cavity 20 may be easier and cheaper than the etching process for forming the deep holes in the exemplary vertical capacitor structure.

Figure 10:
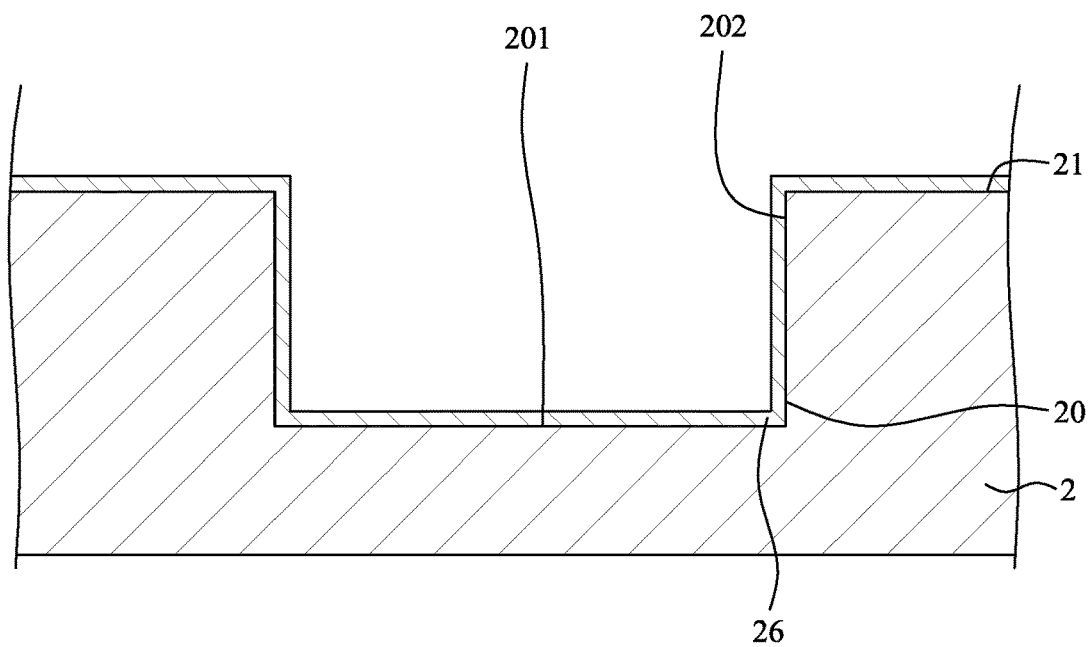
FIG. 10 illustrates one or more stages of an example of a method for manufacturing a vertical capacitor structure according to some embodiments of the present disclosure.

Referring to FIG. 10, an insulating layer 26 (e.g., a barrier layer) is formed to cover the cavity 20 of the substrate 2 such as covering the bottom surface 201 and the lateral surface 202. The insulating layer 26 may further cover the upper surface 21 of the substrate 2. Due to the arrangement of the insulating layer 26, the substrate 2 is insulated from other components disposed thereon. For example, the insulating layer 26 may be formed by oxidizing surfaces of the substrate 2 (e.g., the upper surface 21, and the bottom surface 201 and the lateral surface 202 of the cavity 20). A material of the insulating layer 26 may be silicon oxide. However, the insulating layer 26 may be omitted if the substrate 2 is made of an insulating material (e.g., glass).

Figure 11:
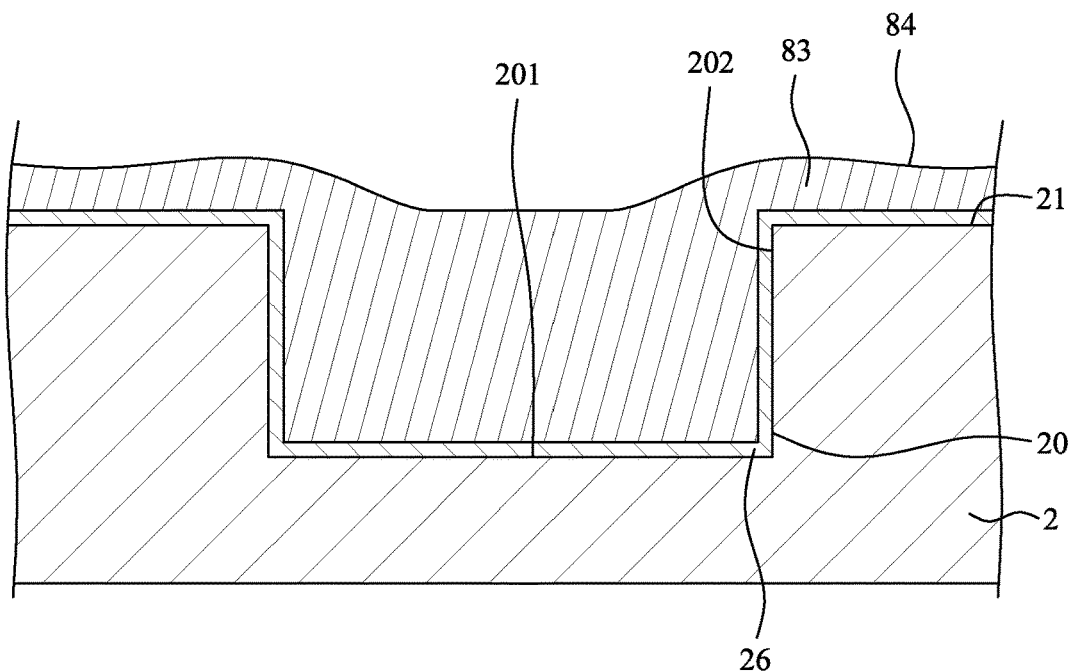
FIG. 11 illustrates one or more stages of an example of a method for manufacturing a vertical capacitor structure according to some embodiments of the present disclosure.

Referring to FIG. 11, a photoimageable dielectric material 83 is disposed in the cavity 20 and on the upper surface 21 of the substrate 2. For example, the photoimageable dielectric material 83 is disposed on the insulating layer 26. The photoimageable dielectric material 83 may be epoxy or polyimide (PI) including photoinitiators, and may not yet be cured. In some embodiments, the photoimageable dielectric material 83 may be applied in a dry film form, thus an upper surface 84 of the photoimageable dielectric material 83 may not be planar.

Figure 12:
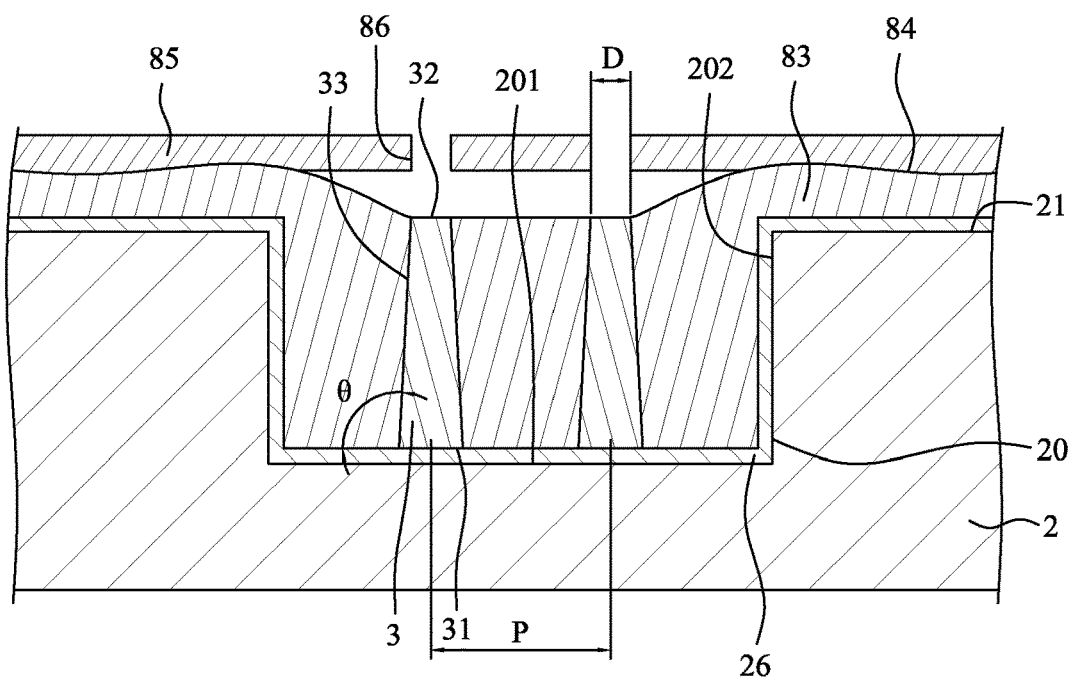
FIG. 12 illustrates one or more stages of an example of a method for manufacturing a vertical capacitor structure according to some embodiments of the present disclosure.

Referring to FIG. 12, a photomask 85 is disposed on the photoimageable dielectric material 83. The photomask 85 defines at least one through hole 86. Then, the photoimageable dielectric material 83 is exposed to a radiation source, and at least a portion of the photoimageable dielectric material 83 which is not covered by the photomask 85 is cured to form at least one pillar 3 in the cavity 20 of the substrate 2. That is, the pillar 3 is the cured portion of the photoimageable dielectric material 83. The pillar 3 is disposed in the cavity 20 of the substrate 2. The pillar 3 has a bottom surface 31, an upper surface 32 opposite to the bottom surface 31, and a lateral surface 33 extending between the bottom surface 31 and the upper surface 32. The upper surface 32 is a portion of the upper surface 84 of the photoimageable dielectric material 83.

Figure 13:
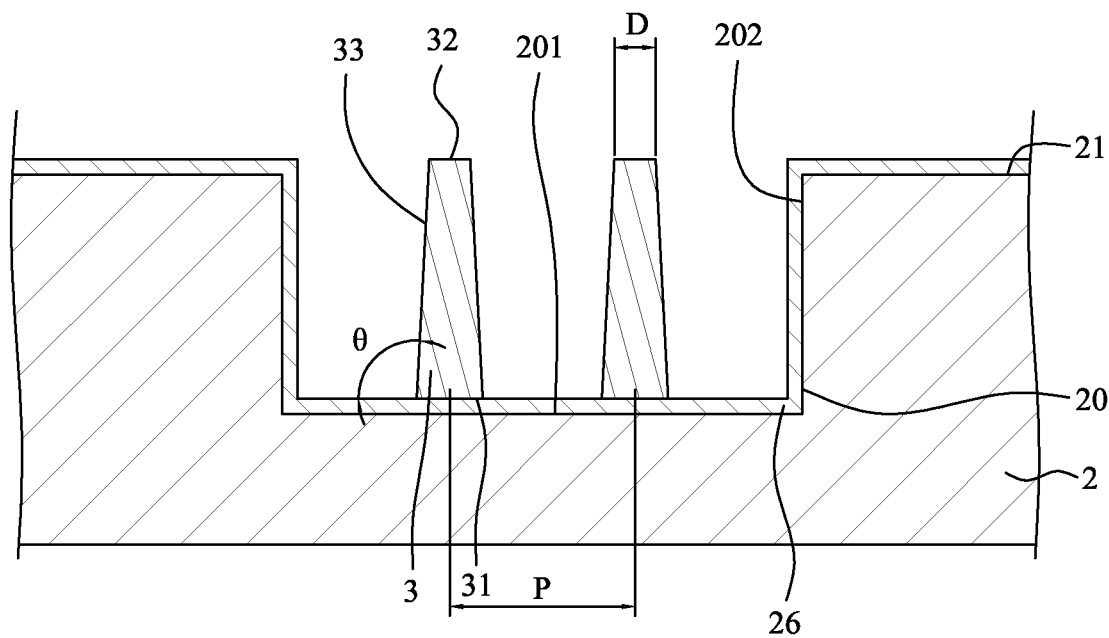
FIG. 13 illustrates one or more stages of an example of a method for manufacturing a vertical capacitor structure according to some embodiments of the present disclosure.

Referring to FIG. 13, the photoimageable dielectric material 83 is developed, and the lateral surface 33 of the pillar 3 is exposed. That is, a portion (e.g., uncured portion) of the photoimageable dielectric material 83, excluding the pillar 3, is removed. Thus, the pillar 3 stands on the insulating layer 26. The bottom surface 31 is disposed on and contacts the insulating layer 26. That is, the bottom surface 31 is a boundary between the pillar 3 and the insulating layer 26. For example, the bottom surface 31 is adhered to the insulating layer 26. In some embodiments, a height of the pillar 3 may be substantially equal to the depth of the cavity 20 of the substrate 2.

As shown in FIG. 13, the pillar 3 tapers upward. In some embodiments, the pillar 3 is in a truncated cone-shape (as shown in FIG. 14). For example, the pillar 3 may be in a shape of a right circular cone, while a portion including an apex of the circular cone is omitted. Accordingly, an area of the bottom surface 31 may be greater than an area of the upper surface 32. The lateral surface 33 is not perpendicular to the bottom surface 201 of the cavity 20 of the substrate 2. For example, an angle θ between the lateral surface 33 of the pillar 3 and the bottom surface 201 of the cavity 20 of the substrate 2 is in a range of about 91 degrees to about 95 degrees. In some embodiments, the pillar 3 has a minimum diameter "D". For example, the minimum diameter "D" may be located at or adjacent to the upper surface 32 of the pillar 3. A pitch "P" is defined as a distance between the centers of adjacent two pillars 3. For example, the minimum diameter "D" may be about 20 and the pitch "P" may be equal to or greater than about 40 μm.

FIG. 14 illustrates a perspective view of the structure shown in FIG. 13. FIG. 14 shows 2×2 pillars 3 for illustration purpose. However, the amount and arrangement of the pillar 3 are not limited in the present disclosure. As shown in FIG. 13 and FIG. 14, there is an empty space surrounding the pillars 3. That is, the empty space is disposed between the lateral surfaces 33 of the pillars 3, and between the lateral surface 33 of the pillar 3 and the lateral surface 202 of the cavity 20 of the substrate 2.

Figure 15:
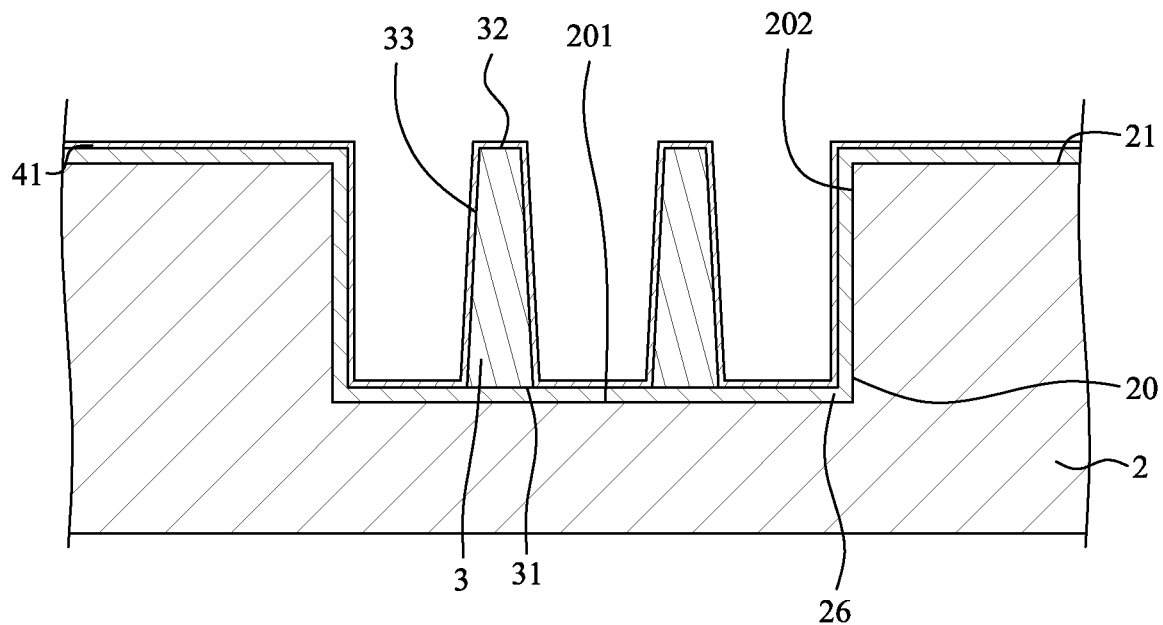
FIG. 15 illustrates one or more stages of an example of a method for manufacturing a vertical capacitor structure according to some embodiments of the present disclosure.

Referring to FIG. 15, a first conductive layer 41 is formed to cover and conformal to the cavity 20 of the substrate 2 and the pillar 3. For example, the first conductive layer 41 covers and is conformal to the upper surface 32 and the lateral surface 33 of the pillar 3, portions of the bottom surface 201 of the cavity 20 which is not covered by the pillar 3, and the lateral surface 202 of the cavity 20 of the substrate 2. Since the angle θ between the lateral surface 33 of the pillar 3 and the bottom surface 201 of the cavity 20 of the substrate 2 is in a range of about 91 degrees to about 95 degrees, the first conductive layer 41 may be disposed on and extend smoothly along the lateral surface 33 of the pillar 3.

The first conductive layer 41 is insulated from the substrate 2. For example, the first conductive layer 41 covers the insulating layer 26, such that the first conductive layer 41 is insulated from the substrate 2. The first conductive layer 41 is further disposed on the upper surface 21 of the substrate 2. The first conductive layer 41 may be made of a conductive material, and may be formed by physical or chemical vapor deposition.

Figure 16:
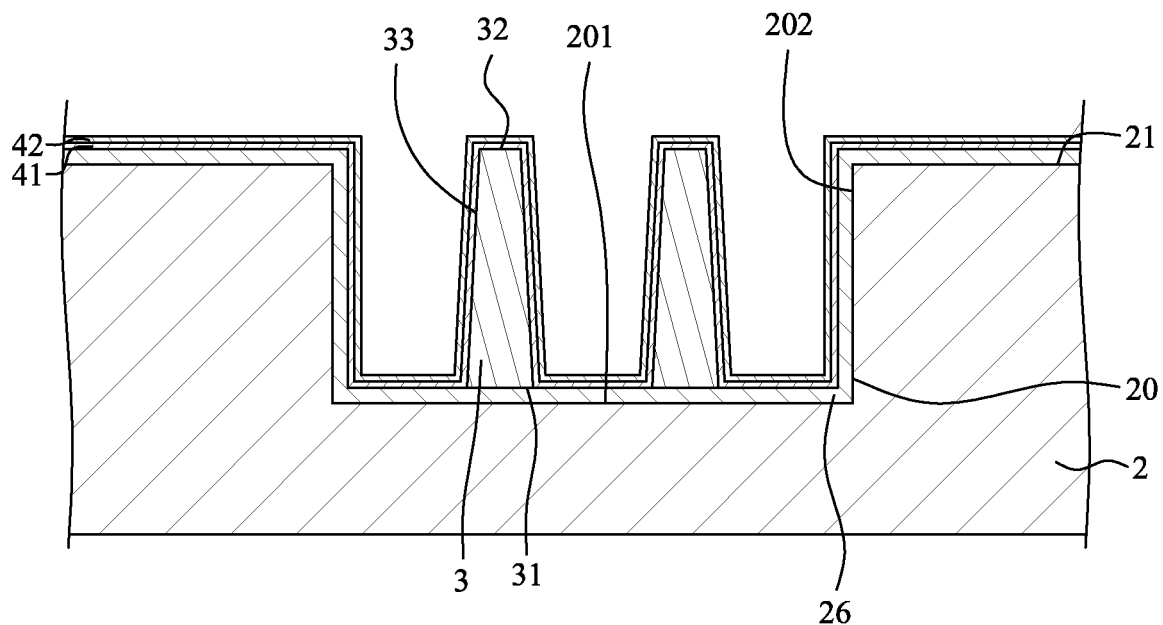
FIG. 16 illustrates one or more stages of an example of a method for manufacturing a vertical capacitor structure according to some embodiments of the present disclosure.

Referring to FIG. 16, a first dielectric layer 42 is formed to cover and conformal to the first conductive layer 41. For example, the first dielectric layer 42 is disposed on and contacts the first conductive layer 41. The first dielectric layer 42 may further be disposed on the upper surface 21 of the substrate 2. The first dielectric layer 42 covers the first conductive layer 41 on the upper surface 21 of the substrate 2. The first dielectric layer 42 may be made of a dielectric material, such as $Ta_2O_5$, $Al_2O_3$, $TiO_2$ or $HfO_2$. A relative permittivity of the first dielectric layer 42 may be about 8 to about 80. The first dielectric layer 42 may also be formed by physical or chemical vapor deposition, or by atomic layer deposition (ALD). A thickness of the first dielectric layer 42 may be about 10 nm to about 20 nm.

Figure 17:
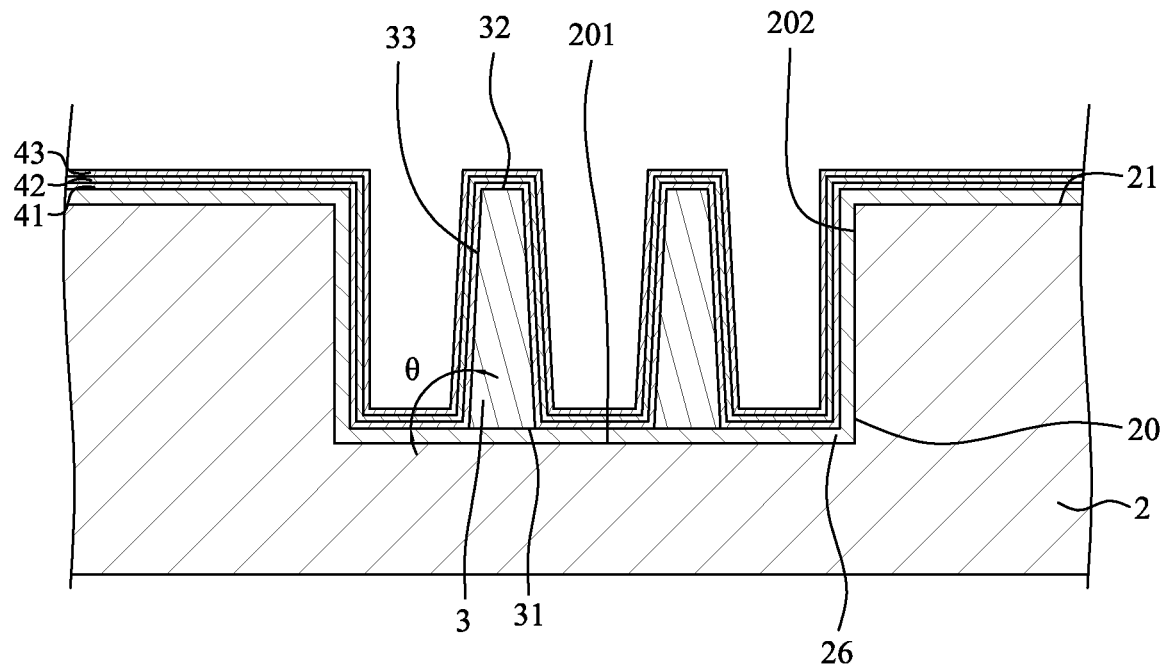
FIG. 17 illustrates one or more stages of an example of a method for manufacturing a vertical capacitor structure according to some embodiments of the present disclosure.

Referring to FIG. 17, a second conductive layer 43 is formed to cover and conformal to the first dielectric layer 42. For example, the second conductive layer 43 is disposed on and contacts the first dielectric layer 42. The second conductive layer 43 may further be disposed on the upper surface 21 of the substrate 2. The second conductive layer 43 may be made of a conductive material, and may be formed by physical or chemical vapor deposition.

Figure 18:
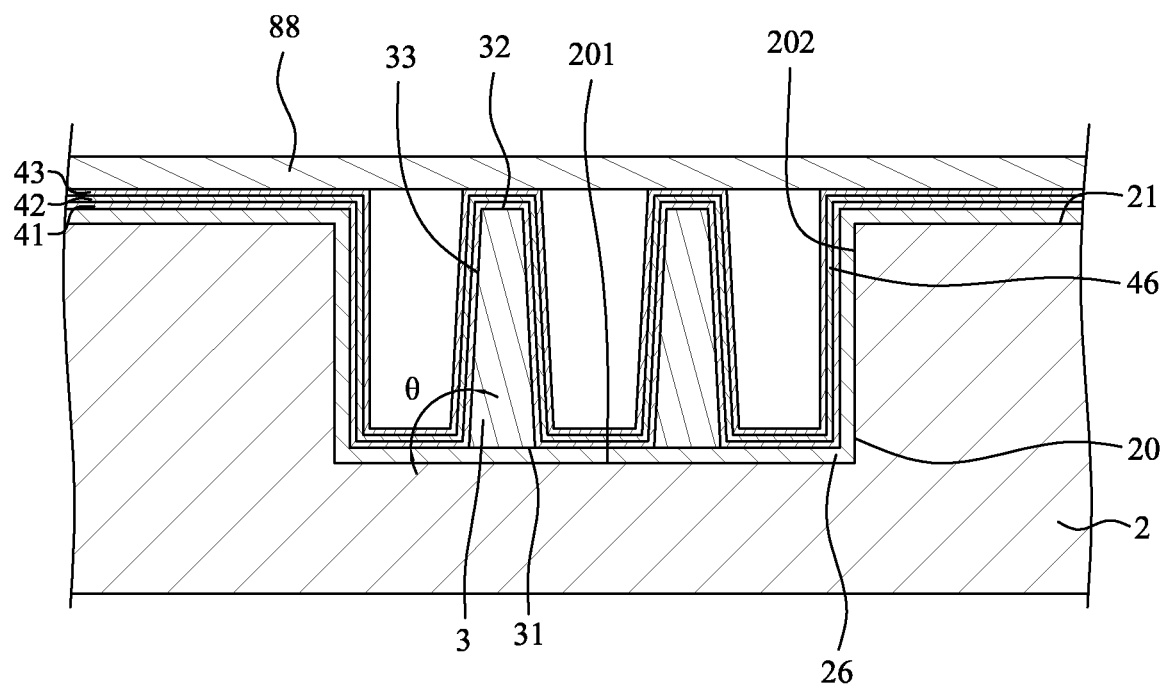
FIG. 18 illustrates one or more stages of an example of a method for manufacturing a vertical capacitor structure according to some embodiments of the present disclosure.

Referring to FIG. 18, a photoresist layer 88 is disposed on the second conductive layer 43. The photoresist layer 88 may be applied in a dry film form, and may be laminated to the second conductive layer 43. Thus, the photoresist layer 88 may not extend into the cavity 20.

Figure 19:
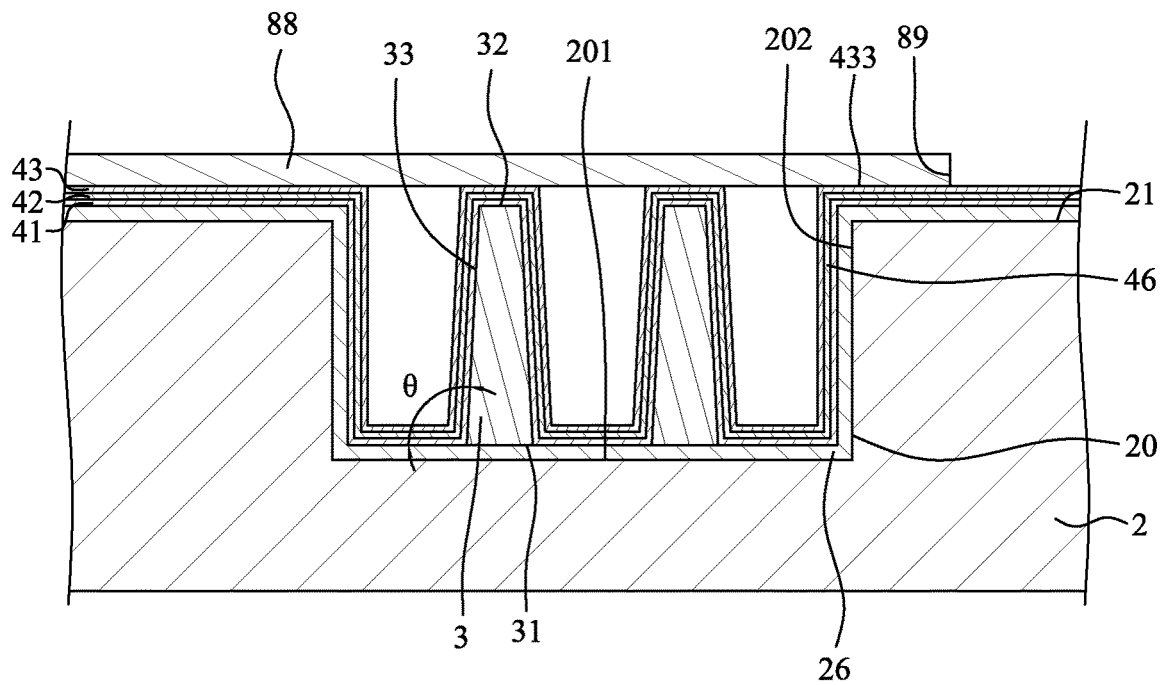
FIG. 19 illustrates one or more stages of an example of a method for manufacturing a vertical capacitor structure according to some embodiments of the present disclosure.

Referring to FIG. 19, the photoresist layer 88 is patterned to define a through hole 89.

Figure 20:
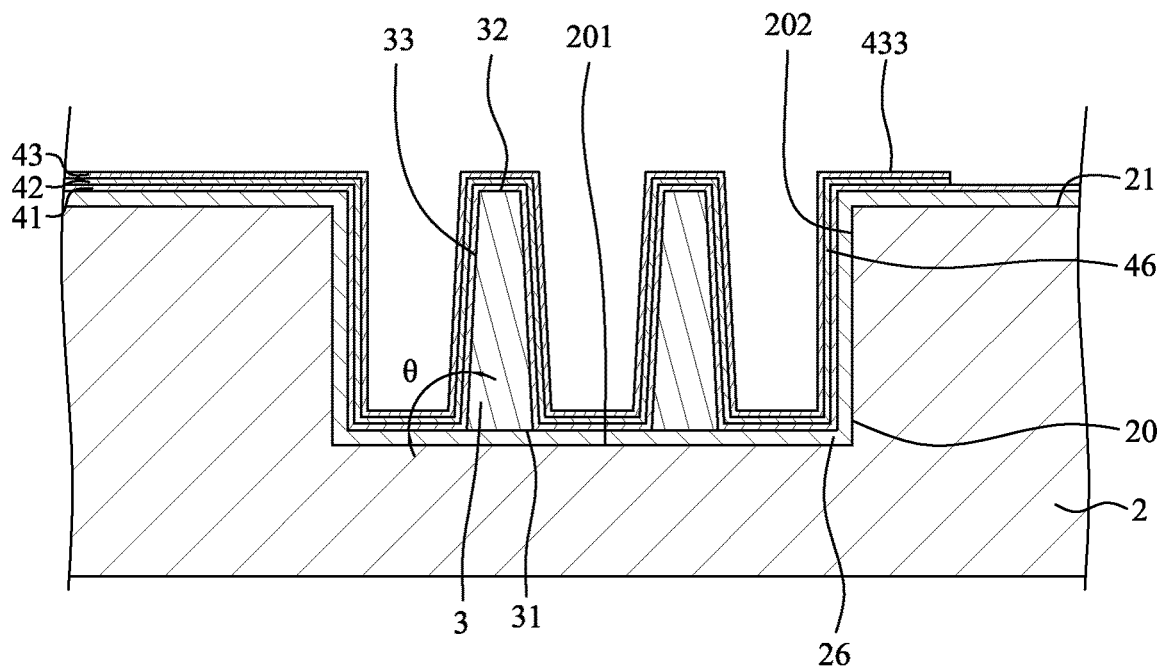
FIG. 20 illustrates one or more stages of an example of a method for manufacturing a vertical capacitor structure according to some embodiments of the present disclosure.

Referring to FIG. 20, the first dielectric layer 42 and the second conductive layer 43 is etched with the photoresist layer 88 serving as a mask to form a pad portion 433 of the second conductive layer 43, and to expose a portion of the first conductive layer 41. That is, portions of the first dielectric layer 42 and the second conductive layer 43 corresponding to the through hole 89 of the photoresist layer 88 are removed. Then, the photoresist layer 88 is removed.

Figure 21:
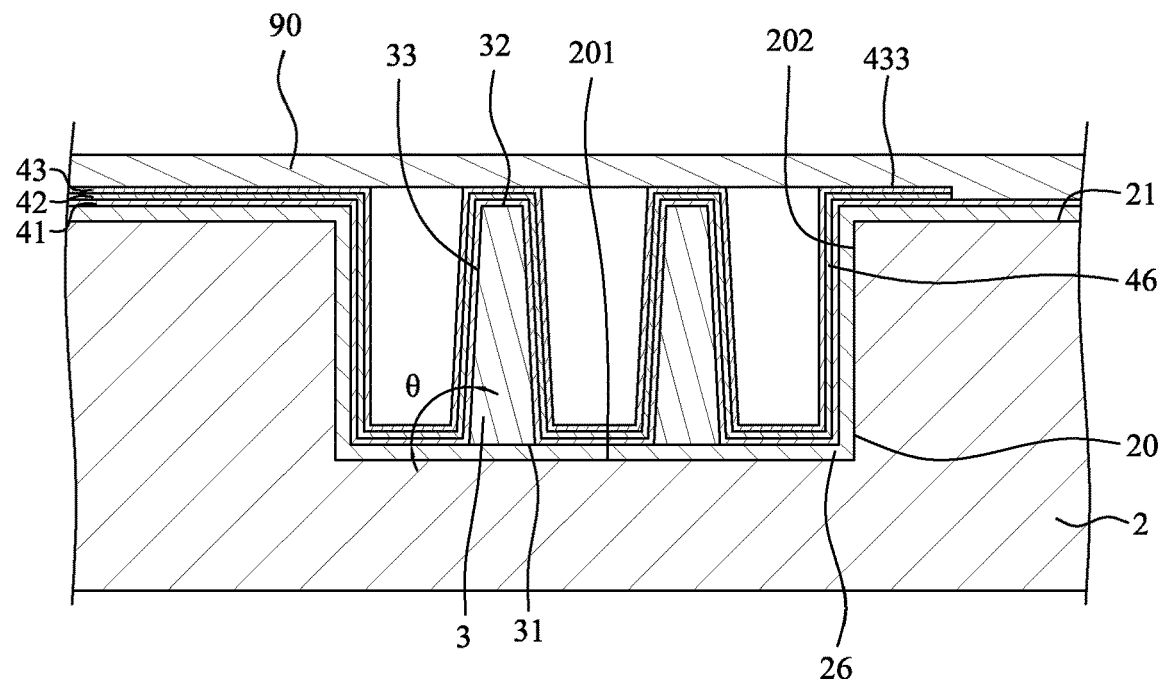
FIG. 21 illustrates one or more stages of an example of a method for manufacturing a vertical capacitor structure according to some embodiments of the present disclosure.

Referring to FIG. 21, a photoresist layer 90 is disposed on the second conductive layer 43 and on the first conductive layer 41. The photoresist layer 90 may be applied in a dry film form, and may be laminated to the second conductive layer 43. Thus, the photoresist layer 90 may not extend into the cavity 20.

Figure 22:
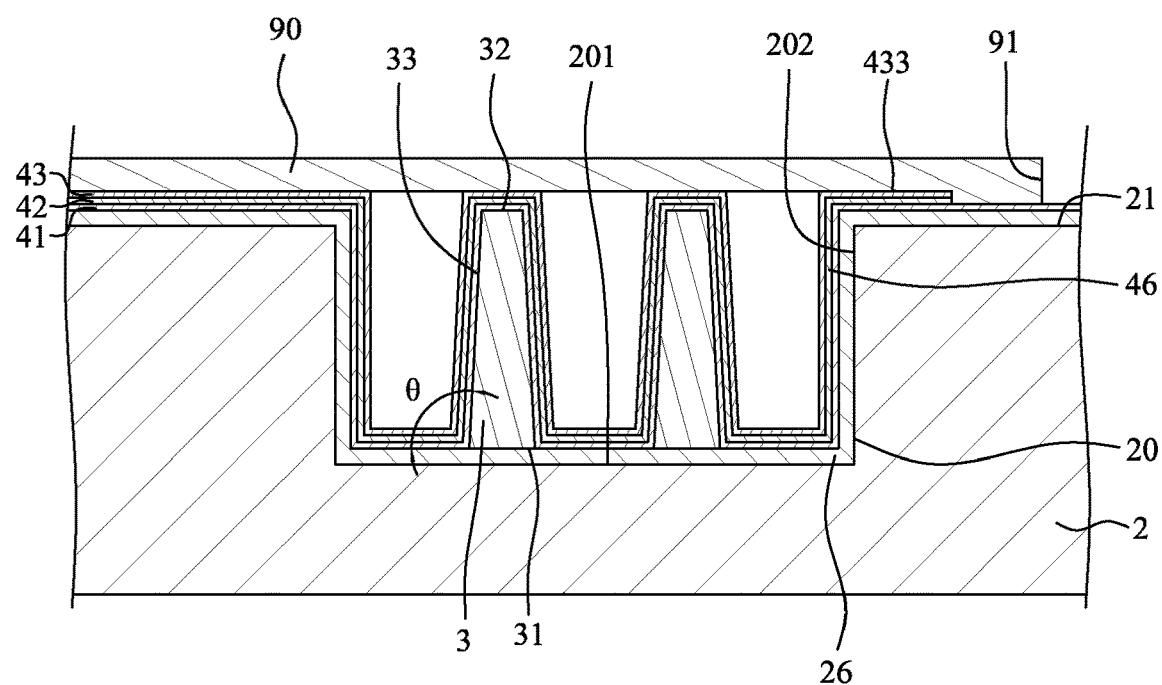
FIG. 22 illustrates one or more stages of an example of a method for manufacturing a vertical capacitor structure according to some embodiments of the present disclosure.

Referring to FIG. 22, the photoresist layer 90 is patterned to define a through hole 91.

Figure 23:
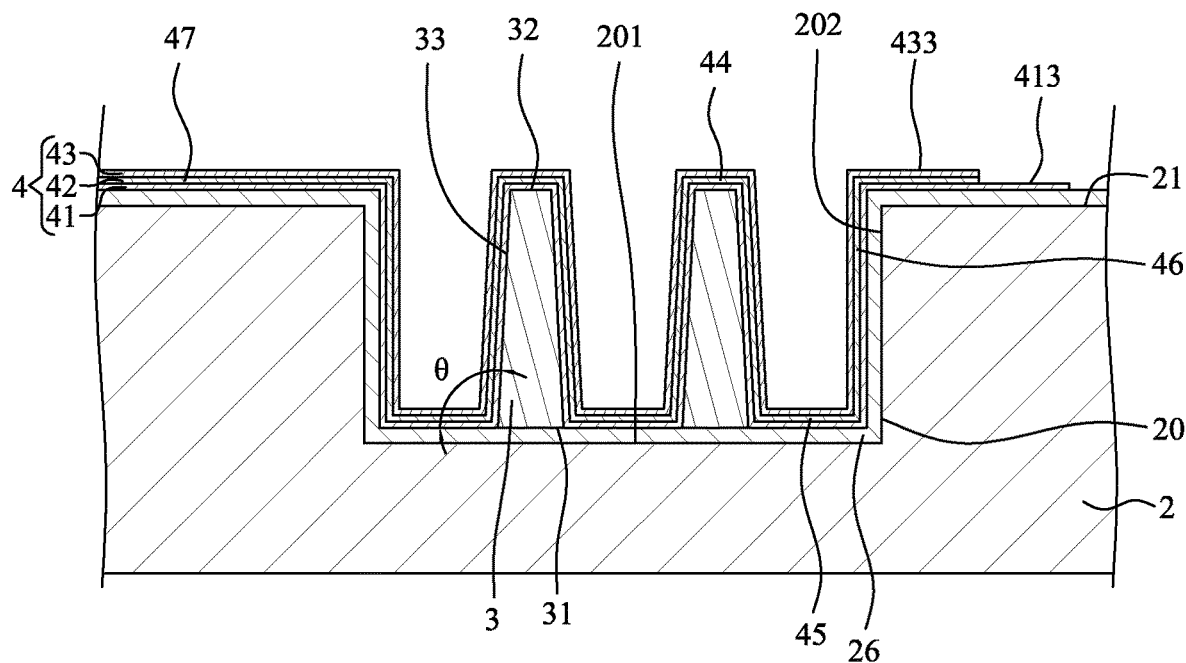
FIG. 23 illustrates one or more stages of an example of a method for manufacturing a vertical capacitor structure according to some embodiments of the present disclosure.

Referring to FIG. 23, the first conductive layer 41 is etched with the photoresist layer 90 serving as a mask to form a pad portion 413 of the first conductive layer 41. The pad portion 413 of the first conductive layer 41 is exposed from the first dielectric layer 42 and the first second conductive layer 43. That is, portions of the first conductive layer 41 corresponding to the through hole 91 of the photoresist layer 90 are removed. Then, the photoresist layer 90 is removed. Accordingly, a capacitor component 4 is formed and includes the first conductive layer 41, the first dielectric layer 42, and the second conductive layer 43. That is, the first conductive layer 41, the first dielectric layer 42 and the second conductive layer 43 jointly form the capacitor component 4. The capacitor component 4 is a vertical capacitor. A cross section of the capacitor component 4, as shown in FIG. 23, is substantially in a serpentine shape or a rectangular wave shape.

The capacitor component 4 may have at least one first portion 44, a second portion 45, a third portion 46 and a fourth portion 47. The first portion 44 is in a truncated hollow cone shape, and is disposed on and conformal to the pillar 3. That is, the first portion 44 is disposed on the upper surface 32 and the lateral surface 33 of the pillar 3. The first portion 44 may taper upward. The second portion 45 extends from a lower edge of the first portion 44 to the edge of the bottom surface 201 of the cavity 20 of the substrate 2, and is disposed on a bottom surface 201 of the cavity 20 of the substrate 2. The second portion 45 is substantially in a plane shape. The third portion 46 extends from an edge of the second portion 45 to the top edge of the cavity 20 of the substrate 2, and is disposed on a lateral surface 202 of the cavity 20 of the substrate 2. The third portion 46 is substantially perpendicular to the second portion 45. An angle θ at an intersection of the first portion 44 and the second portion 45 is in a range between about 91 degrees to about 95 degrees. The fourth portion 47 extends from an upper edge of the third portion 46, and is disposed on the upper surface 21 of the substrate 2. The fourth portion 47 is substantially perpendicular to the third portion 46.

Figure 24:
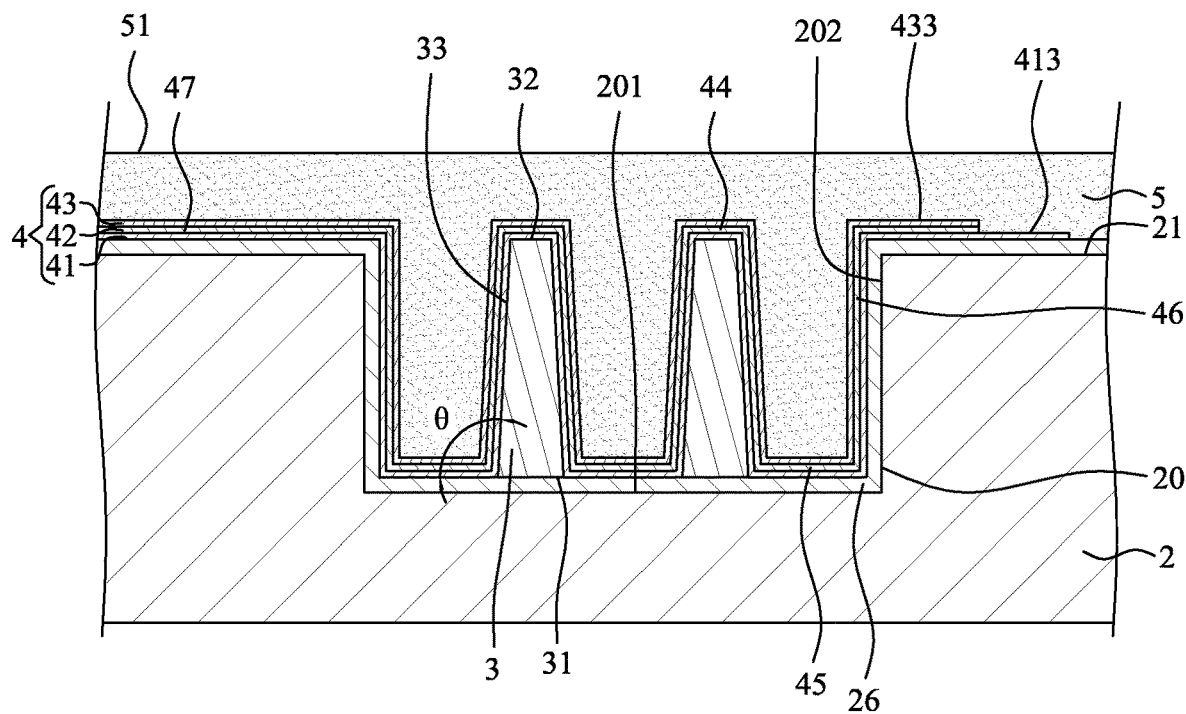
FIG. 24 illustrates one or more stages of an example of a method for manufacturing a vertical capacitor structure according to some embodiments of the present disclosure.

Referring to FIG. 24, a dielectric structure 5 is formed to covers the capacitor component 4. The dielectric structure 5 is disposed in the cavity 20 and on the upper surface 21 of the substrate 2. For example, the dielectric structure 5 fills the cavity 20 of the substrate 2, and has an upper surface 51 which may substantially be planar. A material of the dielectric structure 5 may include an insulating material, a passivation material, a dielectric material or a solder resist material, such as, for example, a benzocyclobutene (BCB) based polymer or a polyimide (PI). As shown in FIG. 24, the dielectric structure 5 covers the first portion 44 of the capacitor component 4. That is, the peripheral outer surface of the first portion 44 of the capacitor component 4 is surrounded by the dielectric structure 5.

Figure 25:
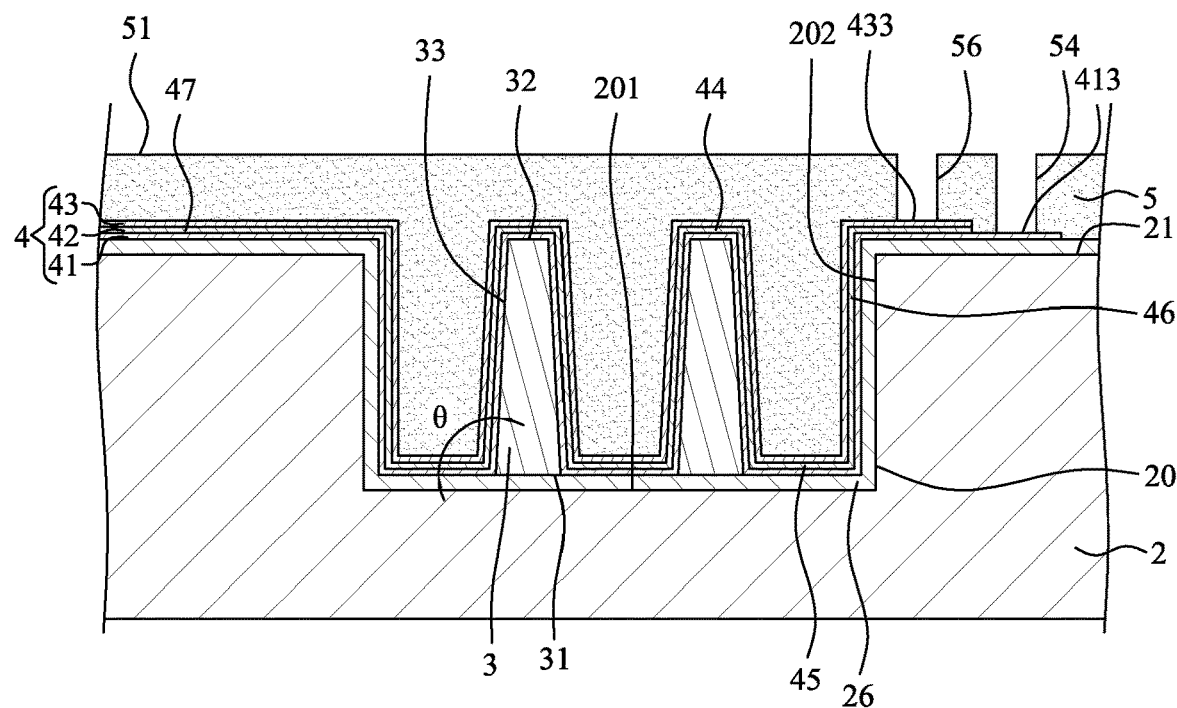
FIG. 25 illustrates one or more stages of an example of a method for manufacturing a vertical capacitor structure according to some embodiments of the present disclosure.

Referring to FIG. 25, a first opening 54 and a second opening 56 are formed in and extend through the dielectric structure 5. The first opening 54 and the second opening 56 may be located on the upper surface 21 of the substrate 2. The first opening 54 exposes a portion of the first conductive layer 41, such as the pad portion 413 of the first conductive layer 41. The second opening 56 exposes a portion of the second conductive layer 43, such as the pad portion 433 of the second conductive layer 43.

Figure 26:
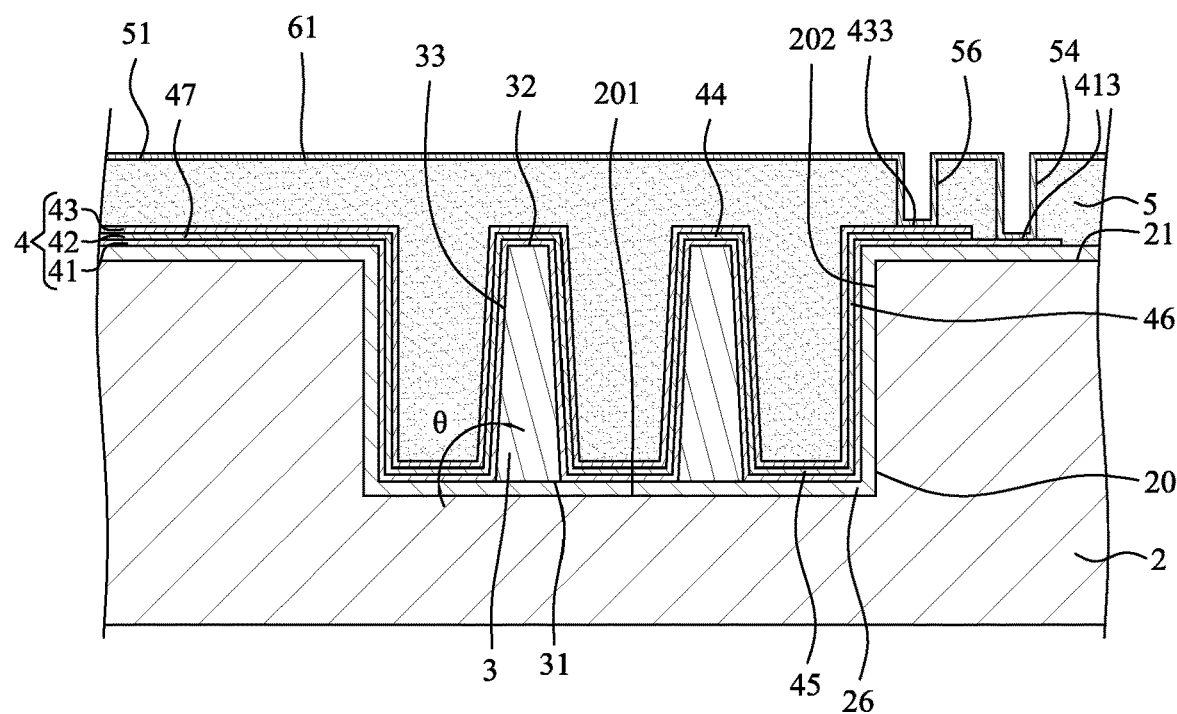
FIG. 26 illustrates one or more stages of an example of a method for manufacturing a vertical capacitor structure according to some embodiments of the present disclosure.

Referring to FIG. 26, a seed layer 61 is formed in the first opening 54 and the second opening 56, and on the upper surface 51 of the dielectric structure 5. The seed layer 61 may be made of copper and/or titanium, and may be formed by sputtering.

Figure 27:
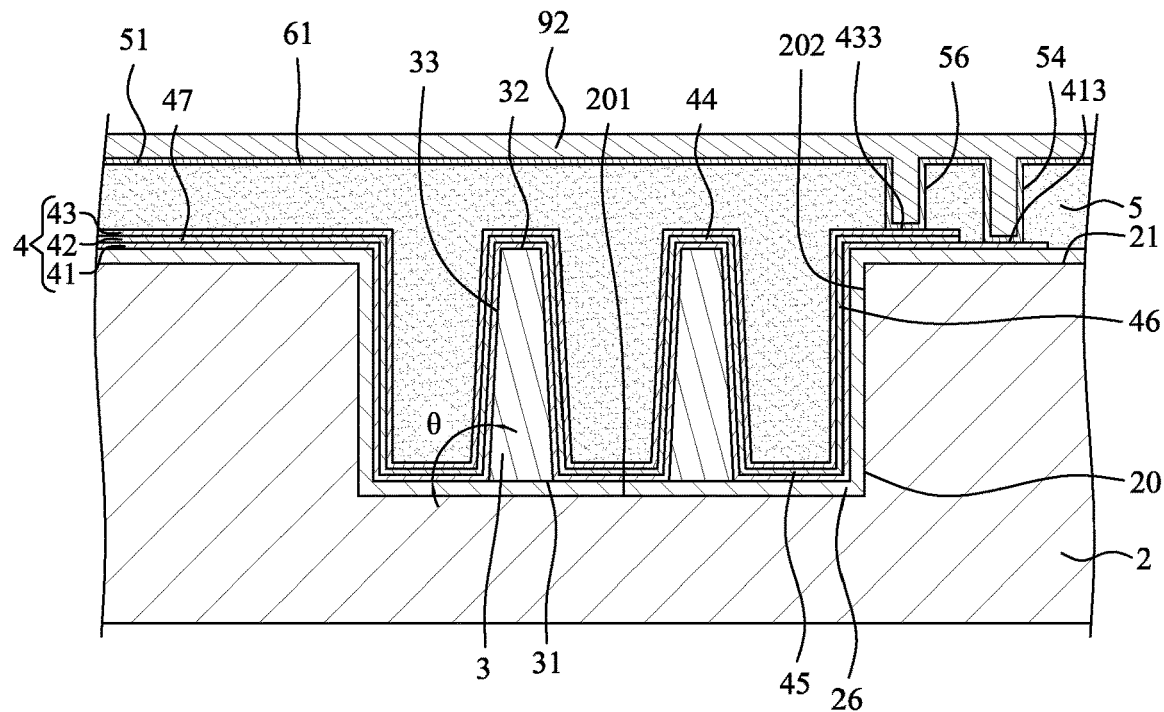
FIG. 27 illustrates one or more stages of an example of a method for manufacturing a vertical capacitor structure according to some embodiments of the present disclosure.

Referring to FIG. 27, a photoresist layer 92 is disposed on the seed layer 61. The photoresist layer 92 may be applied in a dry film form.

Figure 28:
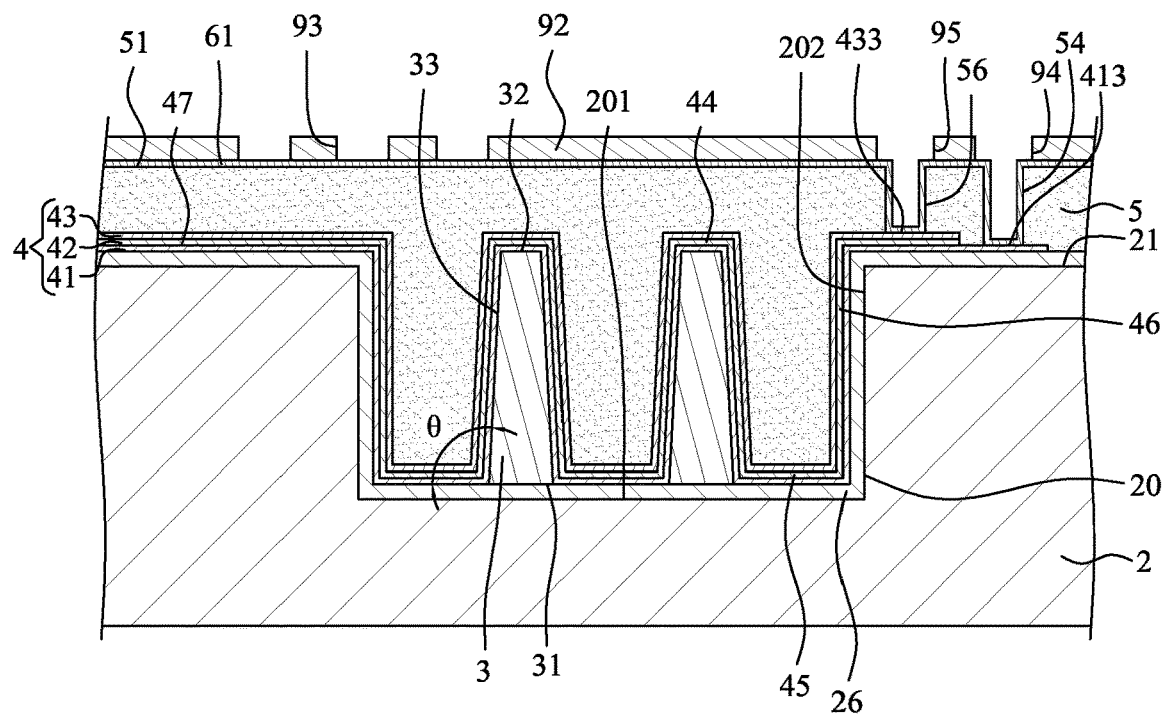
FIG. 28 illustrates one or more stages of an example of a method for manufacturing a vertical capacitor structure according to some embodiments of the present disclosure.

Referring to FIG. 28, the photoresist layer 92 is patterned to define a first through hole 93 on the seed layer 61, a second through hole 94 corresponding to (or above) the first opening 54 of the dielectric structure 5, and a third through hole 95 corresponding to (or above) the second opening 56 of the dielectric structure 5.

Figure 29:
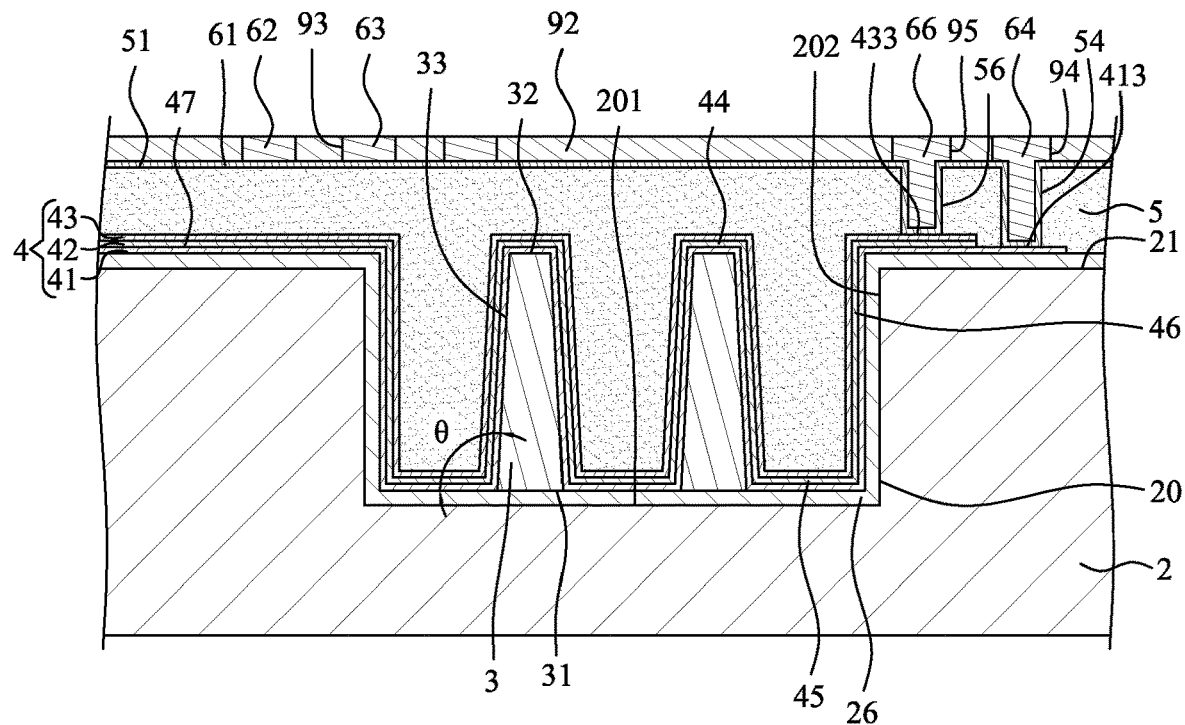
FIG. 29 illustrates one or more stages of an example of a method for manufacturing a vertical capacitor structure according to some embodiments of the present disclosure.

Referring to FIG. 29, a conductive layer 62 is formed in the first through hole 93, the second through hole 94 and the third through hole 95 of the photoresist layer 92. The conductive layer 62 may be made of copper, and may be formed by plating. Accordingly, conductive layer 62 includes a trace 63 disposed in the first through hole 93 of the photoresist layer 92, a first terminal 64 disposed in the second through hole 94 of the photoresist layer 92 and in the first opening 54 of the dielectric structure 5, and a second terminal 66 disposed in the second through hole 95 of the photoresist layer 92 and in the second opening 56 of the dielectric structure 5. That is, a metal material is disposed in the first opening 54 of the dielectric structure 5 to contact the first conductive layer 41 to form the first terminal 64, and a metal material is disposed in the second opening 56 of the dielectric structure 5 to contact the second conductive layer 43 to form the second terminal 66.

Figure 30:
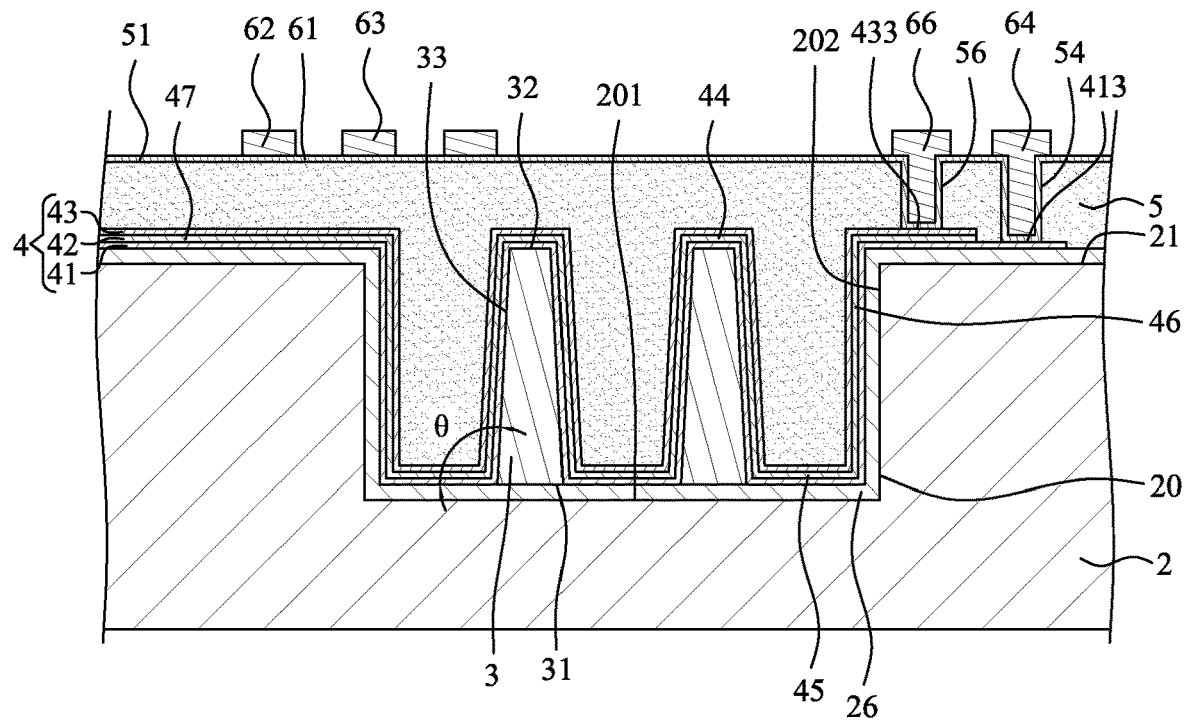
FIG. 30 illustrates one or more stages of an example of a method for manufacturing a vertical capacitor structure according to some embodiments of the present disclosure.

Referring to FIG. 30, the photoresist layer 92 is removed. Then, a portion of the seed layer 61 which is not covered by the conductive layer 62 is removed, thus forming the circuit layer 6. The circuit layer 6 may be a redistribution layer (RDL) that includes the trace 63, the first terminal 64 and the second terminal 66. Then, a singulation process is conducted to form the vertical capacitor structure 1 as shown in FIGS. 1 and 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A vertical capacitor structure, comprising:
    a substrate defining a cavity;
    at least one protrusion disposed in the cavity, wherein the at least one protrusion is insulated and spaced apart from the substrate;
    a first conductive layer covering the cavity of the substrate and the at least one protrusion, wherein the first conductive layer is conformal with a surface of the at least one protrusion;
    a first dielectric layer covering the first conductive layer;
    a second conductive layer covering the first dielectric layer;
    a first terminal and a second terminal disposed over the substrate and non-overlapping with the cavity, wherein the first terminal contacts the first conductive layer, and the second terminal contacts the second conductive layer and is spaced apart from the first conductive layer; and
    a dielectric structure encapsulating the first terminal, the second terminal, a lateral surface of the first conductive layer and a lateral surface of the second conductive layer.

2. The vertical capacitor structure of claim 1, further comprising an insulating layer disposed under the first conductive layer, wherein a portion of the insulating layer is exposed from the first conductive layer and contacts the dielectric structure.

3. A vertical capacitor structure, comprising:
a substrate defining a cavity;
at least one protrusion disposed in the cavity, wherein the at least one protrusion is insulated and spaced apart from the substrate, wherein a top surface of the at least one protrusion is substantially aligned with a top surface of the substrate;
a first conductive layer covering the cavity of the substrate and the at least one protrusion, wherein the first conductive layer is conformal with a surface of the at least one protrusion;
a first dielectric layer covering the first conductive layer; and
a second conductive layer covering the first dielectric layer.

4. A vertical capacitor structure, comprising:
a substrate defining a cavity;
at least one protrusion disposed in the cavity, wherein the at least one protrusion is insulated and spaced apart from the substrate, wherein a height of the at least one protrusion is substantially equal to a depth of the cavity;
a first conductive layer covering the cavity of the substrate and the at least one protrusion, wherein the first conductive layer is conformal with a surface of the at least one protrusion;
a first dielectric layer covering the first conductive layer; and
a second conductive layer covering the first dielectric layer.

5. A vertical capacitor structure, comprising:
a substrate defining a cavity;
at least one protrusion disposed in the cavity, wherein the at least one protrusion is insulated and spaced apart from the substrate;
a first conductive layer covering the cavity of the substrate and the at least one protrusion, wherein the first conductive layer is conformal with a surface of the at least one protrusion;
a first dielectric layer covering the first conductive layer; and
a second conductive layer covering the first dielectric layer, wherein the first conductive layer, the first dielectric layer and the second conductive layer jointly form a capacitor component, the vertical capacitor structure further comprises a first terminal, a second terminal and a third terminal electrically connected to the capacitor component, wherein an elevation of a bottom surface of the first terminal is lower than an elevation of a bottom surface of the second terminal, and the elevation of the bottom surface of the second terminal is lower than an elevation of a bottom surface of the third terminal.

6. A vertical capacitor structure, comprising:
a substrate defining a cavity;
at least one protrusion disposed in the cavity, wherein the at least one protrusion is insulated and spaced apart from the substrate;
a first conductive layer covering the cavity of the substrate and the at least one protrusion, wherein the first conductive layer is conformal with a surface of the at least one protrusion;
a first dielectric layer covering the first conductive layer;
a second conductive layer covering the first dielectric layer; and
a conductive layer disposed over the at least one protrusion, the conductive layer includes a plurality of traces, the at least one protrusion includes a first pillar and a second pillar, and a pitch between the plurality of traces of the conductive layer is less than a pitch between the first pillar and the second pillar.

7. A vertical capacitor structure, comprising:
a substrate defining a cavity;
at least one protrusion disposed in the cavity, wherein the at least one protrusion is insulated and spaced apart from the substrate;
a first conductive layer covering the cavity of the substrate and the at least one protrusion, wherein the first conductive layer is conformal with a surface of the at least one protrusion;
a first dielectric layer covering the first conductive layer; and
a second conductive layer covering the first dielectric layer, wherein the cavity includes a first sidewall and a second sidewall intersecting with the first sidewall, wherein the at least one protrusion includes a corner protrusion disposed most adjacent to the first sidewall and the second sidewall, wherein a distance between the corner protrusion and the first sidewall is different from a distance between the corner protrusion and the second sidewall.

8. A vertical capacitor structure, comprising:
a substrate defining a cavity;
at least one protrusion disposed in the cavity, wherein the at least one protrusion is insulated and spaced apart from the substrate;
a first conductive layer covering the cavity of the substrate and the at least one protrusion, wherein the first conductive layer is conformal with a surface of the at least one protrusion;
a first dielectric layer covering the first conductive layer; and
a second conductive layer covering the first dielectric layer, wherein the at least one protrusion includes a first pillar, a second pillar and a third pillar, wherein the first pillar and the second pillar are arranged along a first direction, the second pillar and the third pillar are arranged along a second direction non-parallel with the first direction, wherein a pitch between the first pillar and the second pillar is equal to a pitch between the second pillar and the third pillar.

9. A vertical capacitor structure, comprising:
a substrate defining a cavity;
at least one protrusion disposed in the cavity, wherein the at least one protrusion is insulated and spaced apart from the substrate;
a first conductive layer covering the cavity of the substrate and the at least one protrusion, wherein the first conductive layer is conformal with a surface of the at least one protrusion;
a first dielectric layer covering the first conductive layer;
a second conductive layer covering the first dielectric layer; and
a conductive layer disposed over the at least one protrusion, wherein the conductive layer includes a trace overlapping the at least one protrusion and the cavity.

10. The vertical capacitor structure of claim 9, further comprising an insulating layer disposed on a bottom surface of the cavity of the substrate, wherein the at least one protrusion protrudes from the insulating layer.

11. The vertical capacitor structure of claim 9, wherein an interface exists between the at least one protrusion and the substrate, and the interface is substantially aligned with a bottom surface of the first conductive layer in the cavity.

12. The vertical capacitor structure of claim 11, wherein in a cross-sectional view, a width of the at least one protrusion is reduced from the interface to a top surface of the at least one protrusion gradually.

13. The vertical capacitor structure of claim 9, wherein the at least one protrusion includes a plurality of pillars arranged in at least one 2×2 array in the cavity.

14. The vertical capacitor structure of claim 13, wherein the at least one protrusion includes at least one pillar that is in a truncated cone-shape.

15. The vertical capacitor structure of claim 14, wherein the first conductive layer, the first dielectric layer and the second conductive layer jointly form a capacitor component, wherein in a top view, the capacitor component completely covers a circumference of the at least one pillar.

* * * * *